United States Patent
Takasugi

(10) Patent No.: US 6,278,644 B1
(45) Date of Patent: Aug. 21, 2001

(54) SERIAL ACCESS MEMORY HAVING DATA REGISTERS SHARED IN UNITS OF A PLURALITY OF COLUMNS

(75) Inventor: Atsushi Takasugi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/522,919

(22) Filed: Mar. 10, 2000

(30) Foreign Application Priority Data

Sep. 6, 1999  (JP) ................................................ 11-251599

(51) Int. Cl.$^7$ ...................................................... G11C 7/00
(52) U.S. Cl. ............... 365/221; 365/189.04; 365/230.05; 365/240
(58) Field of Search ..................................... 365/221, 240, 365/189.04, 189.05, 230.05, 189.12, 233, 63

(56) References Cited

U.S. PATENT DOCUMENTS

| | | | |
|---|---|---|---|
| 4,710,903 | 12/1987 | Hereth et al. | 365/194 |
| 4,796,231 | 1/1989 | Pinkham | 365/189 |

(List continued on next page.)

FOREIGN PATENT DOCUMENTS

| | | |
|---|---|---|
| 0 062 547 A2 | 10/1982 | (EP) . |
| 0 182 719 | 5/1986 | (EP) . |
| 0 473 127 A2 | 3/1992 | (EP) . |
| 0 473 127 A3 | 3/1992 | (EP) . |
| 0 487 819 A2 | 6/1992 | (EP) . |
| 0 487 819 A3 | 6/1992 | (EP) . |
| 61-123875 | 6/1986 | (JP) . |
| 61-149989 | 7/1986 | (JP) . |
| 64-59694 | 3/1989 | (JP) . |

OTHER PUBLICATIONS

U.S. application No. 08/973,764, filed Feb. 8, 1997.
U.S. application No. 09/009,265, filed Jan. 20, 1998.
U.S. application No. 09/055,186, filed Apr. 6, 1998.
U.S. application No. 09/096,585, filed Jun. 12, 1998.
U.S. application No. 08/336,661.

Primary Examiner—Richard Elms
Assistant Examiner—Hien Nguyen
(74) Attorney, Agent, or Firm—Jones Volentine, PLLC

(57) ABSTRACT

A serial access memory reduces a chip size and saves a process development. The serial access memory has first decoders that output first selection signals in response to a received address signal, write registers for temporarily storing data, a first switch that is connected between the write data buses and the write registers and provides conduction between the write data buses and the write registers in response to the first selection signals, a memory array having memory cells and a plurality of memory columns wherein the memory cells are connected through word lines, and a second switch that is connected between the write registers and the memory columns and provides conduction between the write registers and the memory columns in response to second selection signals, wherein the write registers are connected to a predetermined number of the memory columns, and the second switch provides conduction between the write registers and only one of the present invention number of the memory columns in response to the second selection signals.

31 Claims, 20 Drawing Sheets

U.S. PATENT DOCUMENTS

| | | | |
|---|---|---|---|
| 5,132,678 | 7/1992 | Morris | 340/800 |
| 5,142,275 | 8/1992 | Rockel | 340/709 |
| 5,200,925 | 4/1993 | Morooka | 365/219 |
| 5,260,905 * | 11/1993 | Mori | 365/230.05 |
| 5,264,837 | 11/1993 | Buehler | 345/115 |
| 5,321,665 * | 6/1994 | Balistreri et al. | 365/230.05 |
| 5,400,292 | 3/1995 | Fukiage et al. | 365/230.01 |
| 5,412,399 | 5/1995 | Hara | 345/113 |
| 5,497,353 * | 3/1996 | Sato et al. | 365/230.05 |
| 5,530,670 | 6/1996 | Matsumoto | 365/189.01 |
| 5,543,824 | 8/1996 | Priem et al. | 345/201 |
| 5,646,684 | 7/1997 | Nishizawa et al. | 348/231 |
| 5,680,365 | 10/1997 | Blankenship | 365/230.05 |
| 5,726,948 | 3/1998 | Hush et al. | 365/230.05 |
| 5,732,041 | 3/1998 | Joffe | 365/230.05 |
| 5,805,518 | 9/1998 | Hashimoto et al. | 365/221 |
| 5,835,417 | 11/1998 | Ayukawa et al. | 365/189.04 |

* cited by examiner

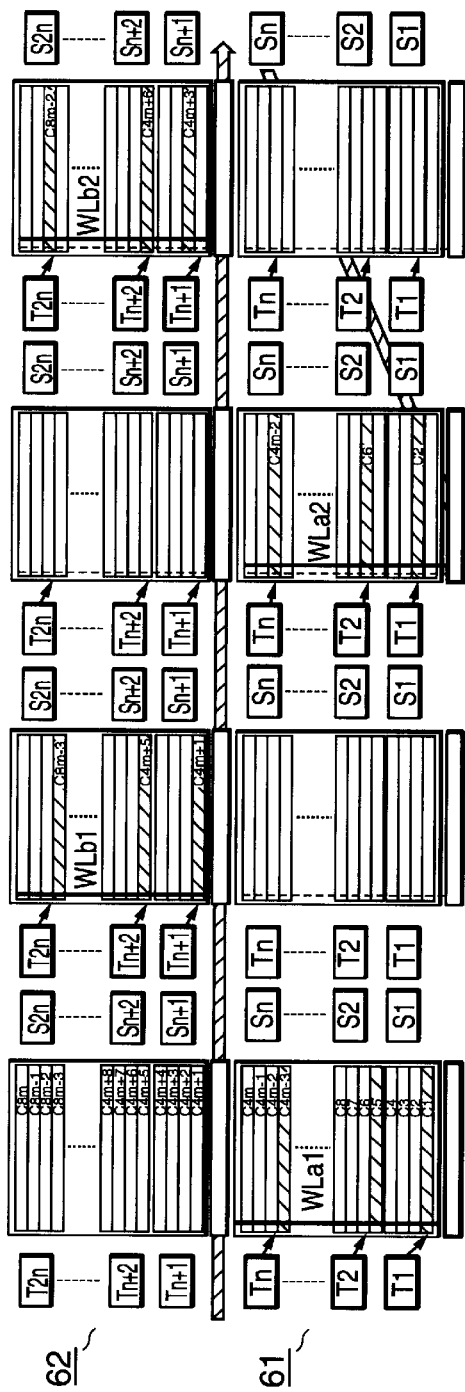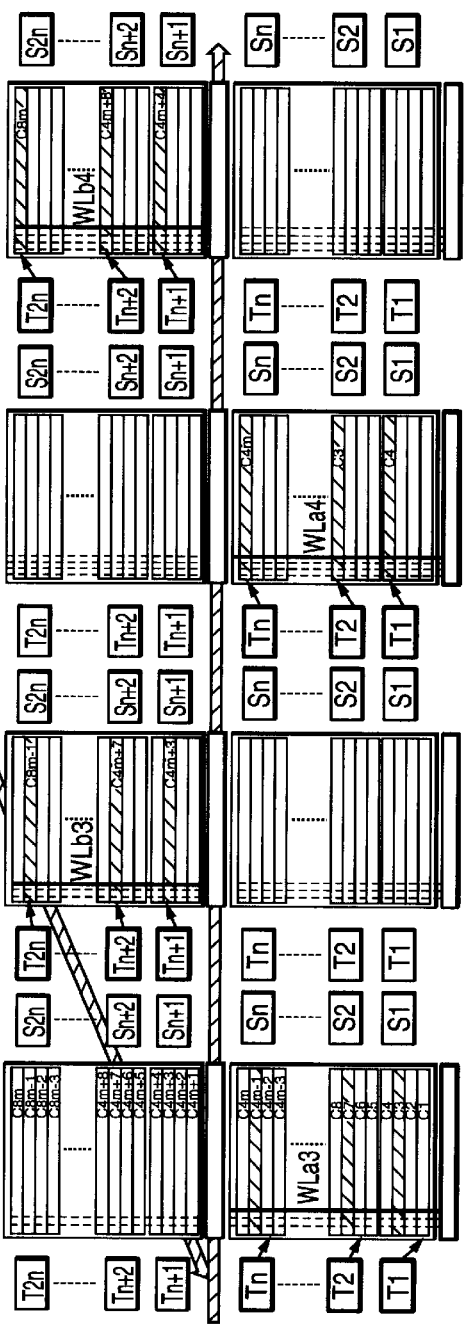

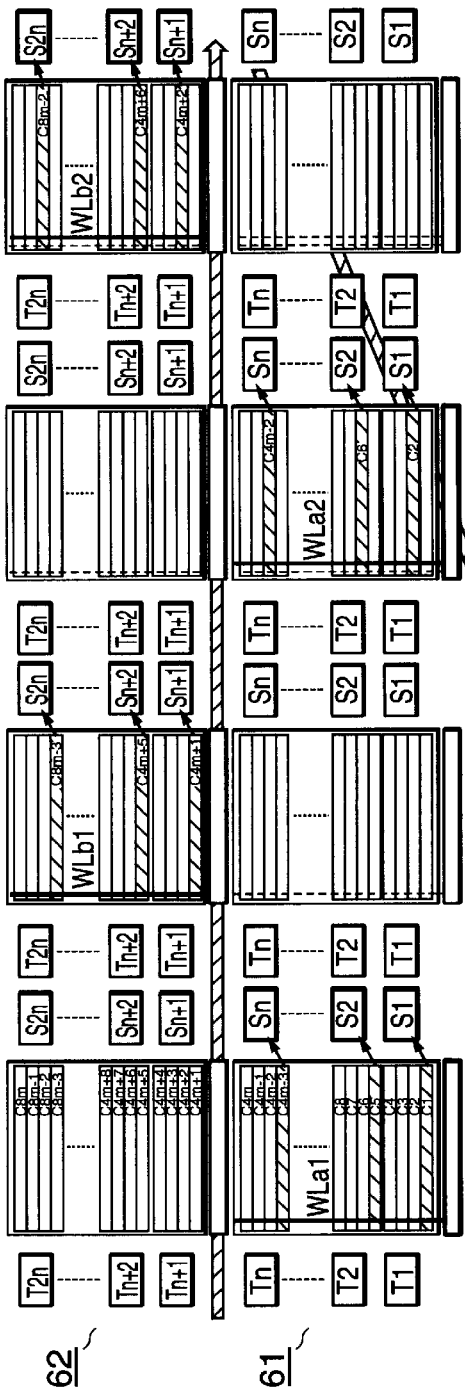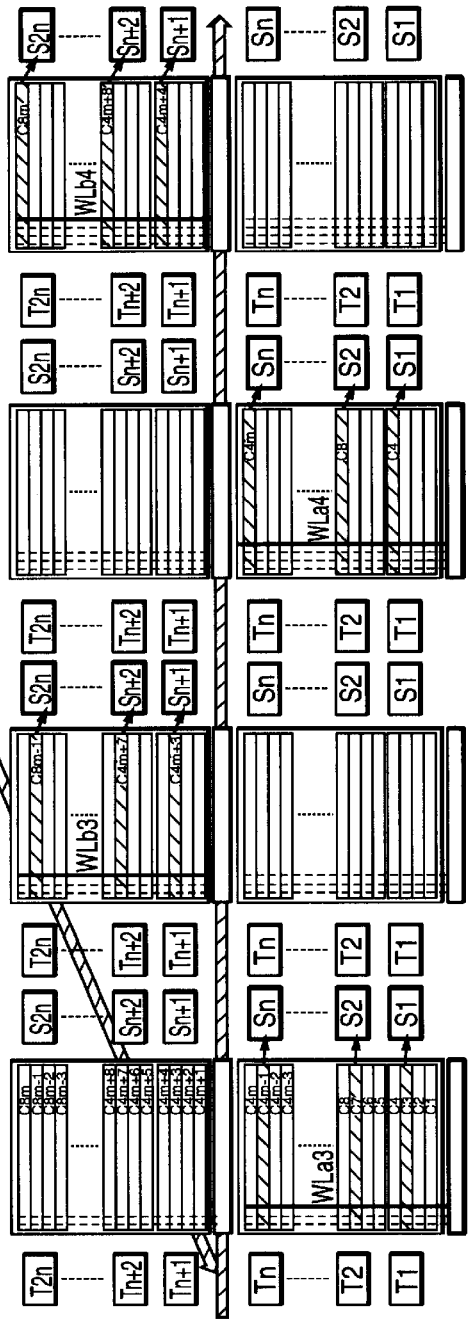

SERIAL ACCESS MEMORY HAVING DATA REGISTERS SHARED IN UNITS OF A PLURALITY OF COLUMNS

BACKGROUND OF THE INVENTION

The present invention relates to a serial access memory and, more particularly, to an asynchronous serial access memory formed of a large-capacity DRAM used in a television set or the like.

A serial access memory employed in a television, a VCR, or the like has an independent input terminal and an independent output terminal, enabling an input clock and an output clock to have entirely different frequencies. This type of asynchronous serial access memory permits simultaneous access to input and output, so that it finds a variety of applications. For example, such an asynchronous serial access memory is used in an application where images recorded on a video tape by a video camera is viewed on a television screen by using a VCR.

In this case, to videotape images using a video camera, a synchronization clock CLK1 of a video camera system. However, when the video tape is set in a VCR for playback, a timing clock is an asymmetric waveform clock due to stretching of the tape or a mechanical operation of a VCR servo system rather than the synchronization clock CLK1 for reading video data from the video tape.

Image data synchronized with the asymmetric waveform clock cannot be subjected to image processing by the VCR, thus requiring conversion into image data synchronized with a shaped synchronization clock CLK2 in the VCR system. For this purpose, the asynchronous serial access memory is used because it enables writing to be accomplished using an asymmetric waveform clock and reading to be accomplished using a shaped clock.

In another example, the asynchronous serial access memory is used to transfer data on a personal computer screen to a television, an LCD panel, or the like. The graphic drawing frequency of the personal computer screen is different from that of the television; therefore, the graphic drawing frequency must be changed to bring the data displayed on the personal computer screen onto the television screen. This is efficiently achieved by using the asynchronous serial access memory because allows input to be performed at the graphic drawing frequency of the personal computer and output to be performed at the frequency of the television.

This type of asynchronous serial access memory has, as its data storage area, a DRAM array that has a large capacity of 2 Mbits or more and has many memory columns that are constituted by plurality of memory cells comprised of transistors and capacitors and are connected to a bit line. The asynchronous serial access memory is further provided with a write data bus for transferring entered data and a write data register that is connected to the write data bus and temporarily saves the entered data. The asynchronous serial access memory is further provided with a read data bus for transferring data to be output and a read data register that is connected to the read data bus and temporarily saves the data to be output.

Normally, the number of memory columns of the asynchronous serial access memory is equal to the number of pixels on a line constituting an image. A television screen with a large screen and a high resolution or a high-resolution LCD panel for a personal computer involves more pixel information on a unit line constituting a screen, requiring more memory columns. This results in a longer write data bus and a longer read data bus with a larger additional capacity. Furthermore, more write data registers and more read data registers are connected to the write data bus and the read data bus, respectively, leading to larger additional capacities of connection nodes. Hence, the increased load capacity causes a slower access.

The asynchronous serial access memory has the DRAM array that is fabricated with minimized bit line pitch and word line pitch for the necessity of achieving a larger capacity. In the asynchronous serial access memory, a write data register and a read data register must be connected for each pair of bit lines. However, the pitch for each pair of bit lines becomes too small to plot each data register pattern according to an applicable process rule, and it becomes necessary to increase the pitch for each pair of bit lines itself. This results in an excessively large chip area and higher cost than that of a typical DRAM.

SUMMARY OF THE INVENTION

Accordingly, an object of the present invention is to provide a serial access memory that is capable of maintaining the same access speed even when a write data bus and a read data bus are extended with a resultant increased additional capacity, and of controlling an increase in cost when a capacity is increased.

According to the present invention, there is provided a serial access memory having an input circuit to which data is supplied, a write data bus connected to the input circuit, a first decoder that outputs a first selection signal in response to a received address signal; a write register for temporarily storing data, a first switch that is connected between the write data bus and the write register and provides conduction between the write data bus and the write register in response to the first selection signal, a memory array that has a plurality of memory cells and a plurality of memory columns in which the memory cells are connected by word lines, and a second switch that is connected between the write register and the memory columns and provides conduction between the write register and the memory columns in response to a second selection signal, wherein the write register is connected to a predetermined number of memory columns, and the second switch is adapted to provide conduction between the write register and only one of the predetermined number of memory columns in response to the second selection signal.

BRIEF DESCRIPTION OF THE DRAWINGS

FIGS. 19A–19H are schematic diagrams illustrating a write transfer operation in the serial access memory in accordance with the present invention.

FIGS. 20A–20H are schematic diagrams illustrating a read transfer operation in the serial access memory in accordance with the present invention.

DESCRIPTION OF THE PREFERRED EMBODIMENTS

Figure 1:
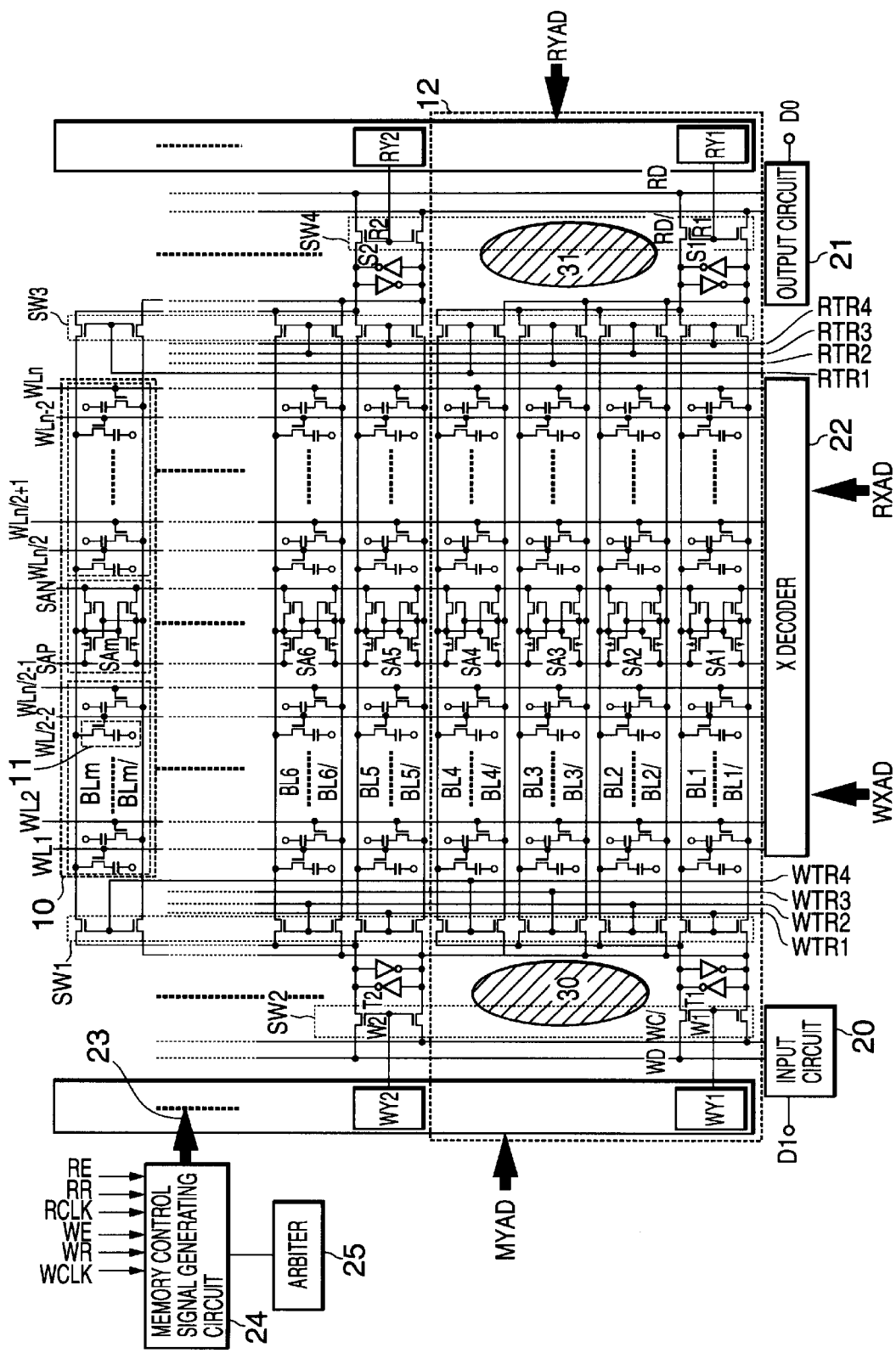
FIG. 1 is a fragmentary circuit diagram showing a serial access memory according to a first embodiment of the present invention.

FIG. 1 is a fragmentary circuit diagram showing a serial access memory in accordance with a first embodiment of the present invention. In a memory column 10, a plurality of memory cells 11 are connected to a pair of bit lines BL1 to BLm and BL1/ to BLm/. Each of the memory cells 11 is a DRAM cell formed of a transistor and a capacitor connected to a word line WL1 to WLn. The memory column 10 is controlled by sense amplifier activation signals SAP and SAN, and has sense amplifiers SA1 to SAm that amplify data in the memory cells 11.

One end of the memory column 10 is connected, via first switch, namely, a transistor pair SW1, to write data registers T1, T2 and so on that temporarily store entered data. Each of the write data registers T1, T2 and so on is constituted by an SRAM cell formed of two inverters, four memory columns 10 being connected to each of the write data registers T1, T2 and so on. Write transfer signals WTR1 through WTR4 are applied to the first switch SW1 so that one of the write data registers T1, T2 and so on and one of the memory columns 10 are selectively connected.

The write data registers T1, T2 and so on are connected via a second switch, namely, a transistor pair SW2, to write data buses WD and WD/ through which supplied signals are transferred. Write Y decoders WY1, WY2 and so on that output write transfer signals W1, W2 and so on according to received Y addresses WYAD for writing are connected to the second switch SW2. In response to the write transfer signals W1, W2 and so on, the second switch SW2 connects the write data buses WD and WD/ and write data registers T1, T2 and so on.

The other end of the memory column 10 is connected, via a third switch, namely, a transistor pair SW3, to read data registers S1, S2 and so on that temporarily store data output from the memory cells 11. Each of the read data registers S1, S2 and so on is constituted by an SRAM cell formed of two inverters, four memory columns 10 being connected to each of the read data registers S1, S2 and so on. Read transfer signals RTR1 through RTR4 are applied to the third switch SW3 so that one of the read data registers S1, S2 and so on and one of the memory columns 10 are selectively connected.

The read data registers S1, S2 and so on are connected via a fourth switch, namely, a transistor pair SW4, to read data buses RD and RD/ through which supplied signals are transferred. Read Y decoders RY1, RY2 and so on that output read transfer signals R1, R2 and so on according to received Y addresses RYAD for reading are connected to the fourth switch SW4. In response to the read transfer signals R1, R2 and so on, the fourth switch SW4 connects the read data buses RD and RD/ and read data registers S1, S2 and so on.

The write data buses WD and WD/ are connected via an input circuit 20 to an input terminal DI to which data is input. The read data buses RD and RD/ are connected via an output circuit 21 to an output terminal DO from which data is output.

Word lines WL1 through WLn are connected an X decoder 22. The X decoder 22 selects from among the word lines WL1 through WLn for specifying one of the memory cells 11 at the time of writing in response to an X address WXAD for writing, and also selects from among the word lines WL1 through WLn for specifying one of the memory cells 11 at the time of reading in response to an X address RXAD for reading.

A group that includes a plurality of memory columns (four in the first embodiment), a write Y decoder, and a read Y decoder that are connected to the same write data register and the same read data register is defined as a memory column group 12 herein.

Although not shown in FIG. 1, The serial access memory according to the first embodiment has first and second banks. Each of the first and second banks has a plurality of memory column groups 12 as shown in FIG. 1, and can be independently operated.

An internal control signal 23 for controlling the first and second banks is generated by a memory control signal generating circuit 24. The memory control signal generating circuit 24 receives external signals, such as a write clock signal WCLK, a write reset signal WR, a write enable signal WE, a read clock signal RCLK, a read reset signal RR, and a read enable signal RE.

An arbiter 25 connected to the memory control signal generating circuit 24 orders the above signals to avoid collision of read transfer signals and write transfer signals.

According to the first embodiment of the present invention, four memory columns 10 are connected to one write register T1 or one read register S1, so that the number of registers for the memory columns is reduced, producing pattern spaces 30 and 31 as illustrated in FIG. 1. Hence, a pattern for the write register T1 or the read register S1 can be made with an allowance, without the need for increasing a bit line pitch of the memory columns 10, that is, without the need for increasing the longitudinal dimension in FIG. 1. This allows a chip size to be reduced without adding any changes to a conventional process, thus providing an advantage of saving cost for developing a process and reducing a chip size.

Figure 2:
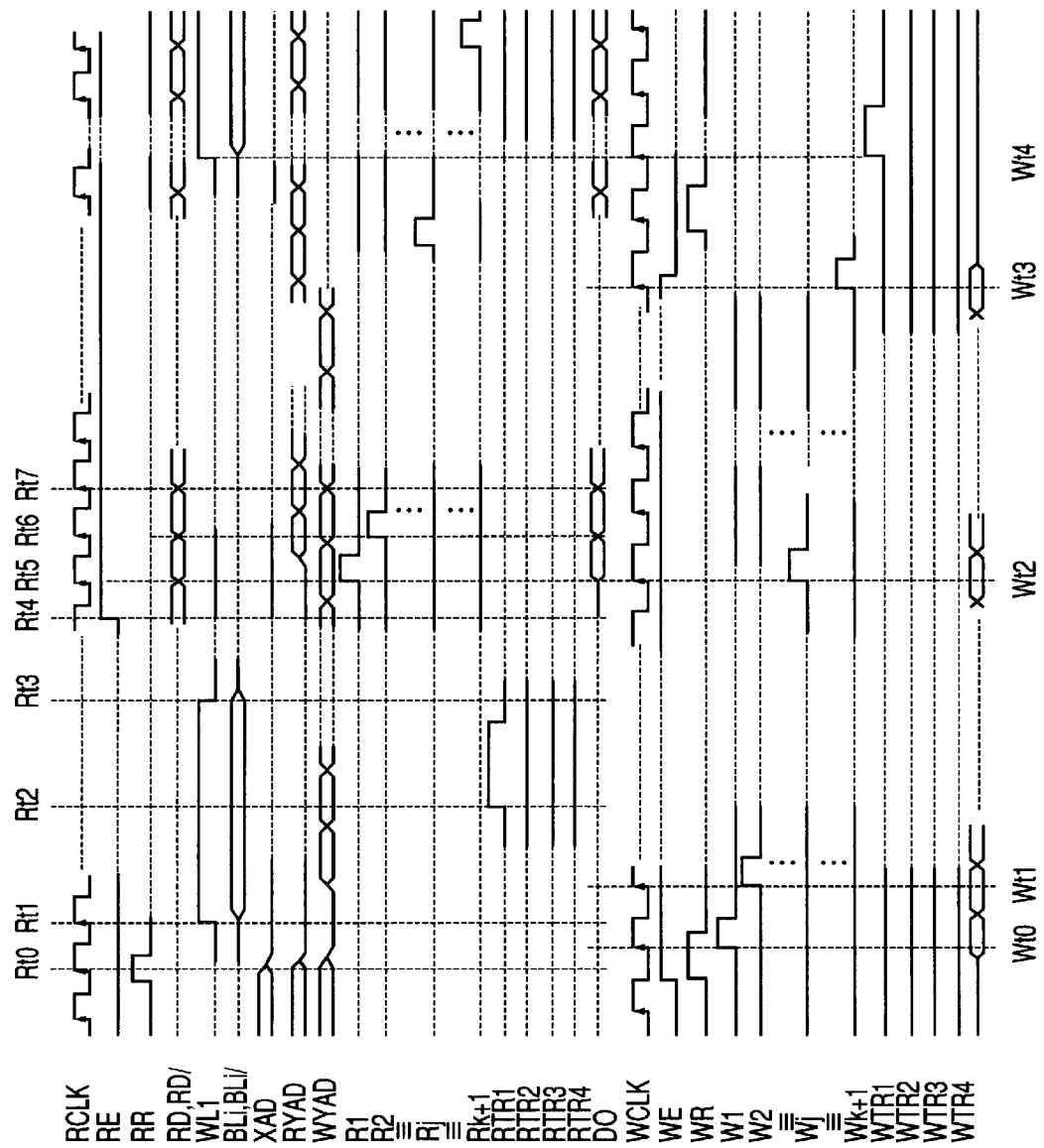
FIG. 2 is a timing chart showing operation timings of the serial access memory according to the first embodiment.

FIG. 2 is a timing chart showing an operation timing of the serial memory according to the first embodiment. An operation of the serial memory according to the first embodiment will now be described with reference to FIG. 2.

Control signals will be captured in synchronization with a rise of the read clock signal RCLK or the write clock signal WCLK to decide a circuit operation.

First, a read operation of the serial memory according to the first embodiment will be first described for each time shown in FIG. 2.

[Time Rt0]

The read reset signal RR is at the high level; therefore, the X address XAD (for the purpose of simplicity, the X address RXAD for reading and the X address WXAD for writing are both expressed "X address XAD") and the Y address RYAD for reading are reset to the low level. In other words, the Y address RYAD for reading is set to a state wherein the address is "0".

[Time Rt1]

The word line WL1 rises and memory cell information in a memory cell group connected to the word line WL1 is transferred to a pair of bit lines BLi and BLi/ (i=0 to m−1). Although it is not shown in FIG. 2, a sense amplifier SAi becomes active when a sense amplifier activating signal SAP is set to the high level and a sense amplifier activating signal SAN is set to the low level. This causes the information on the pair of bit lines BLi and BLi/ to be amplified.

[Time Rt2]

The read transfer signal RTR1 rises, while the read transfer signals RTR2 through RTR4 remain at the low level. This causes a read register Rk−1 and a pair of bit lines BL4k+1 and BL4k+1/ to be connected. Thus, the information on the pair of bit lines BL4k+1 and BL4k+1/ is transferred to the read register Rk−1.

[Time Rt3]

The word line WL1 is switched to the low level, while both sense amplifier activating signals SAP and SAN are at a middle level (at an intermediate potential between the high level and the low level) although it is not shown in FIG. 2. This resets the information on the pair of bit lines BL4k+1 and BL4k+1/. At this time, the read transfer signal RTR1 is at the low level, while the read transfer signals RTR2 through RTR4 remain at the low level.

[Time Rt4]

The read enable signal RE is switched to the high level, and an internal operation for serial reading begins.

[Time Rt5]

In response to the Y address signal RYAD (address "0") for reading, an output R1 of the Y decoder RY1 is switched to the high level. This causes data in the read register S1 to be transferred to the pair of read data buses RD and RD/. The data on the pair of read data buses RD and RD/ is transferred to the output circuit 21 and output from the output terminal DO. Thereafter, The Y address RYAD for reading is incremented to provide an address ("1") used at time Rt6.

[Time Rt6]

In response to the Y address signal RYAD (address "1") for reading, an output R2 of the Y decoder RY2 is switched to the high level. This causes data in the read register S2 to be transferred to the pair of read data buses RD and RD/. The data on the pair of read data buses RD and RD/ is transferred to the output circuit 21 and output from the output terminal DO. Thereafter, The Y address RYAD for reading is incremented to provide an address ("2") used at time Rt7.

[Time Rt7]

In response to the Y address signal RYAD (address "2") for reading, an output R3 of the Y decoder RY3 is switched to the high level. This causes data in the read register S3 to be transferred to the pair of read data buses RD and RD/. The data on the pair of read data buses RD and RD/ is transferred to the output circuit 21 and output from the output terminal DO. Thereafter, the Y address RYAD for reading is incremented to provide an address ("3").

The circuit operation described above is repeated until the address of the Y address signal for reading reaches "k" to perform a series of serial read operation.

A series of serial read operations described below is different from the operation described in conjunction with time Rt2 in that only the read transfer signal RTR2 is switched to the high level, while the remaining read transfer signals, namely, RTR1, RTR3, and RTR4 remain at the low level. This causes the read register Rk−1 and a pair of bit lines BL4k+2 and BL4k+2/ to be connected. Thus, information on the pair of bit lines BL4k+2 and BL4k+2/ is transferred to the read register Rk−1. Thereafter, the operations described in conjunction with times Rt4 through Rt7 are performed in sequence again.

Before the series of serial operations, only the read transfer signal RTR3 is switched to the high level and only the read transfer signal RTR4 is switched to the high level, then only the read transfer signal RTR1 is switched to the high level. This is repeated in the foregoing order.

A write operation of the serial memory according to the first embodiment will now be described for each time illustrated in FIG. 2.

[Time Wt0]

The write reset signal WR is at the high level, so that the Y address WYAD for writing is reset to address "0". Input information of a first bit is captured into the input circuit 20 through the input terminal DI, and transferred to the pair of write data buses WD and WD/. An output W1 of the write Y decoder WY1 is at the high level, so that data on the pair of write data buses WD and WD/ is transferred to the write register T1.

[Time Wt1]

Input information of a second bit is captured into the input circuit 20 through the input terminal DI, and transferred to the pair of write data buses WD and WD/. An output W2 of the write Y decoder WY2 is at the high level, so that data on the pair of write data buses WD and WD/ is transferred to the write register T2.

[Time Wt2]

Input information of a j-th bit is captured into the input circuit 20 through the input terminal DI, and transferred to the pair of write data buses WD and WD/. An output Wj of the write Y decoder WYj is at the high level, so that data on the pair of write data buses WD and WD/ is transferred to the write register Tj.

[Time Wt3]

Input information of a k+1-th bit is captured into the input circuit 20 through the input terminal DI, and transferred to the pair of write data buses WD and WD/. An output Wk+1 of the write Y decoder WYk+1 is at the high level, so that data on the pair of write data buses WD and WD/ is transferred to the write register Tk+1. This completes the entire series of operations of writing to the write registers.

[Time Wt4]

Only the write transfer signal WRT1 is switched to the high level, while the remaining write transfer signals WRT2 through WRT4 remain at the low level. This causes the write registers Ti (i=0 to k) and a pair of bit lines BL4i+1 and BL4i+1/ to be connected. Although it is not shown in FIG. 2, the sense amplifier activating signal SAN is at the low level and the sense amplifier activating signal SAP is at the high level, so that a sense amplifier SA4i+1 is in activation. The word line WL1 is switched to the high level and therefore, data on the pair of bit lines BL4i+1 and BL4i+1/ is written to a memory cell 11 connected to the word line WL1 and the pair of bit lines BL4i+1 and BL4i+1/. For the remaining pairs of bit lines BL4i+2 and BL4i+2/, BL4i+3 and BL4i+3/, and BL4i+4 and BL4i+4/, the information of the memory cell connected to the word line WL1 is read once into the pairs of bit lines and amplified by the sense amplifier, then written to the original memory cell. This operation is generally known as "rewriting".

After that, the series of operations for writing to the write registers that has been described in conjunction with time Wt0 through time wt3 is performed again. Then, the only write transfer signal WRT2 is switches to the high level, while the remaining write transfer signals WRT1, WRT3, and WRT4 remain at the low level. This causes the write registers Ti (i=0 to k) and the pairs of bit lines BL4i+2 and BL4i+2/ to be connected. Thus, data on the pair of bit lines BL4i+2 and BL4i+2/ is written to the memory cell 11 connected to the activated word line and the pair of bit lines BL4i+2 and BL4i+2/. For the remaining pairs of bit lines, the rewriting operation is performed.

The above operations are performed also for the write transfer signals WRT3 and WRT4 in a similar manner, and the serial write operation returns to Wt0 described first.

In the first embodiment, the example wherein one memory column group 12 is comprised of four memory columns; however, the number of the memory columns may be optionally selected as long as it is plural. In the first embodiment, the description has been given of a configuration that both employs the read registers and the write registers. Depending on an application, however, only read registers or write registers may be used to fully enjoy the advantages of the present invention. Furthermore, in the first embodiment, the description has been given separately of the Y decoders for writing and the Y decoders for reading; however, shared Y decoders used for both writing and reading may alternatively used. Furthermore, the first embodiment has the first and second banks; however, only one bank or a plurality of banks may be used.

Figure 3:
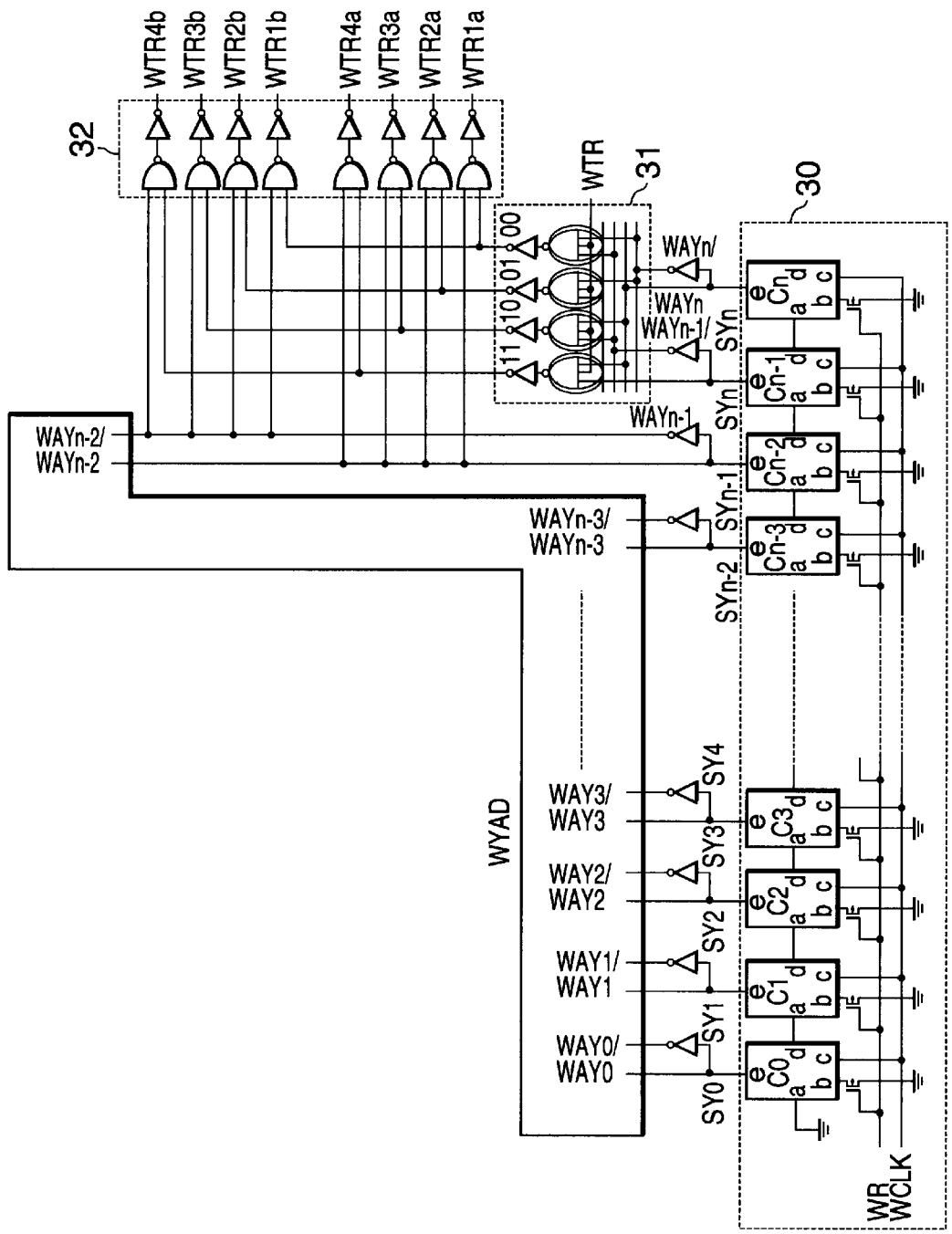
FIG. 3 is a circuit diagram showing a write address generating circuit.
Figure 4:
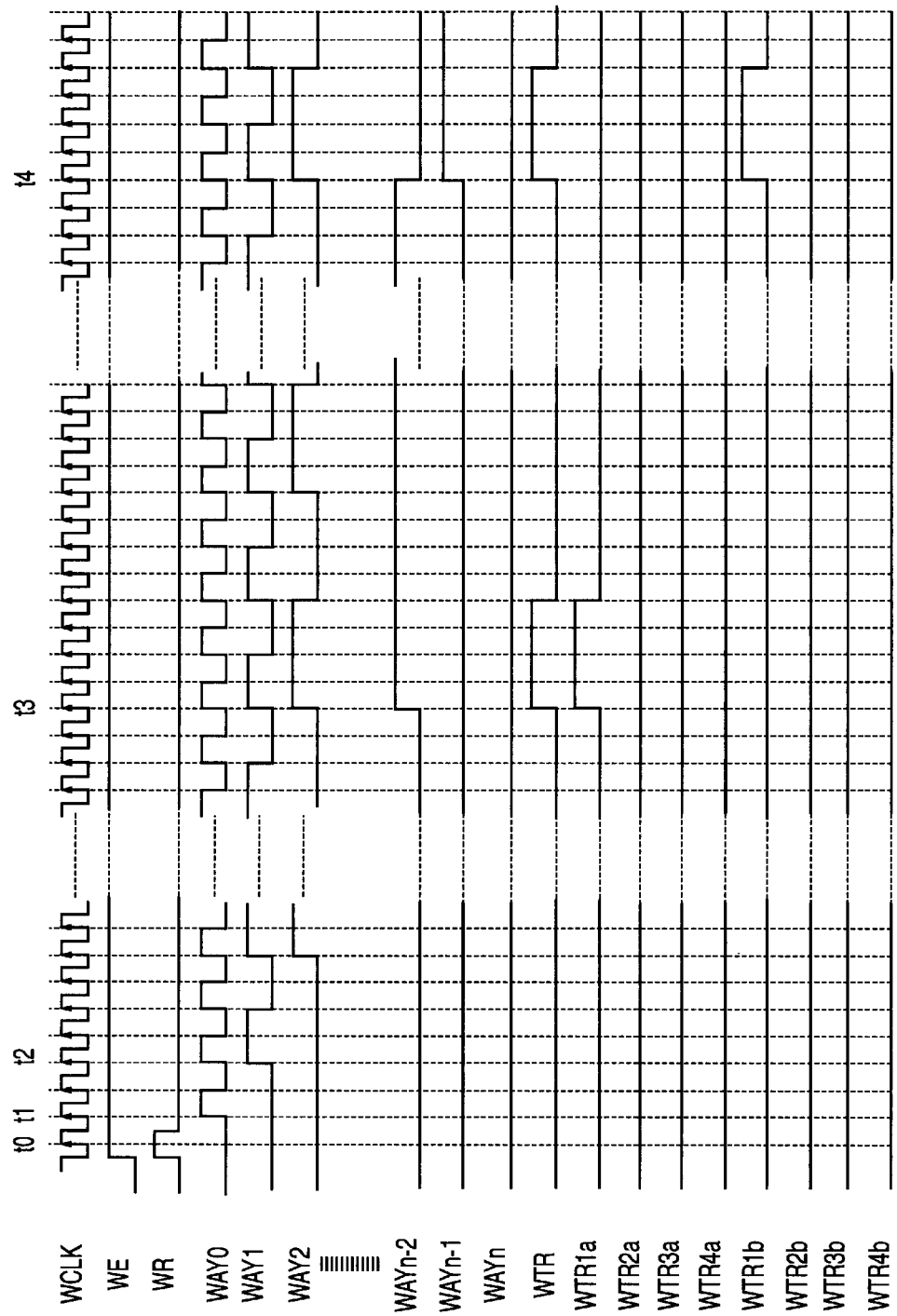
FIG. 4 is a timing chart illustrating an operation of the write address generating circuit.

A circuit for generating the write transfer signals WTR1 through WTR4 in the first embodiment will now be described. FIG. 3 is a circuit diagram showing a write address generating circuit for generating the write Y address WYAD and the write transfer signals WTR1 through WTR4 (write transfer signals WTR1a through WTR4a for the first bank and write transfer signals WTR1b through WTR4b for the second bank in this case). FIG. 4 is a timing chart illustrating an operation of the write address generating circuit.

The write address generating circuit is constituted by a shift register 30, a first decoder 31, and a second decoder 32.

The shift register 30 has n+1 flip-flops C0 to Cn. A write clock signal WCLK is applied to a clock input terminal c of the flip-flops C0 to Cn. A first terminal of an NMOS transistor is connected to a reset terminal of the flip-flops C0 to Cn. A second terminal of the NMOS transistor is grounded, and a write reset signal WR is commonly applied to a gate.

An input a of the first flip-flop C0 is grounded, while an output d is connected to an input of a second flip-flop C1. An output signal from another output e of the first flip-flop C0 and its inverted signal turn into address signals WAY0 and WAY0/ constituting a part of the write Y address WYAD.

The output d of the second flip-flop C1 is connected to an input of the third flip-flop C2. An output signal from another output e of the second flip-flop C1 and its inverted signal turn into address signals WAY1 and WAY1/ constituting a part of the write Y address WYAD.

The same connection relationship applies to an n-th flip-flops. The write Y addresses WYAD include address signals WAY1 to n−2 and WAY1 to n−2/. Address signals WAYn−1, WAYn−1/, WAYn, and WAYn/ are used to generate write transfer signals WTR1a to WTR4b.

The first decoder 31 is constituted of NAND circuits. A first NAND circuit receives the address signals WAYn−1 and WAYn, and a write transfer signal WTR, and its output is inverted by an inverter to turn into a signal 11. A second NAND circuit receives the address signals WAYn−1/ and WAYn, and the write transfer signal WTR, and its output is inverted by the inverter to turn into a signal 10. A third NAND circuit receives the address signals WAYn−1 and WAYn/, and the write transfer signal WTR, and its output is inverted by the inverter to turn into a signal 01. A fourth NAND circuit receives the address signals WAYn−1/ and WAYn/, and the write transfer signal WTR, and its output is inverted by the inverter to turn into a signal 00.

The second decoder 32 is also comprised of NAND circuits. A first NAND circuit receives the output signal 00 of the first decoder and an address signal WAYn−2, and its output is inverted by an inverter to turn into a write transfer signal WTR1a of the first bank. A second NAND circuit receives the output signal 01 of the first decoder and the address signal WAYn−2, and its output is inverted by the inverter to turn into a write transfer signal WTR2a of the first bank. A third NAND circuit receives the output signal 10 of the first decoder and the address signal WAYn−2, and its output is inverted by the inverter to turn into a write transfer signal WTR3a of the first bank. A fourth NAND circuit receives the output signal 11 of the first decoder and the address signal WAYn−2, and its output is inverted by the inverter to turn into a write transfer signal WTR4a of the first bank. A fifth NAND circuit receives the output signal 00 of the first decoder and the address signal WAYn−2/, and its output is inverted by the inverter to turn into a write transfer signal WTR1b of the second bank. A sixth NAND circuit receives the output signal 01 of the first decoder and the address signal WAYn−2/, and its output is inverted by the inverter to turn into a write transfer signal WTR2b of the second bank. A seventh NAND circuit receives the output signal 10 of the first decoder and the address signal WAYn−2/, and its output is inverted by the inverter to turn into a write transfer signal WTR3b of the second bank. An eighth NAND circuit receives the output signal 11 of the first decoder and the address signal WAYn−2/, and its output is inverted by the inverter to turn into a write transfer signal WTR4b of the second bank.

FIG. 4 is a timing chart illustrating an operating of the write address generating circuit shown in FIG. 3.

The moment the write enable signal WE and the write reset signal WR are switched to the high level at time t0 at which the write clock signal WCLK rises, the generation of the address signals is started. Then, at time t1 at which the write clock signal rises, an address signal WAY0 is switched to the high level. Furthermore, at time t2 at which the write clock signal rises, the address signal WAY0 is switched again to the high level, and an address signal WAY1 is switched to the high level. For the address signals WAY0 to WAYn, the write clock signal is divided in sequence; hence, the description thereof will be omitted.

At time t3, the write transfer signal WTR and the address signal WAYn−2 are switched to the high level, while the address signals WAYn−1 and WAYn remain at the low level. This causes the write transfer signal WTR1a of the first bank to be switched to the high level. At time t4, the write transfer signal WTR and the address signal WAYn−1 are switched to the high level, while the address signal WAYn−2 and WAYn are switched to the low level. This causes the write transfer signal WTR1b of the second bank to be switched to the high level. Regarding the remaining write transfer signals WTR2a through WTR4b, a logic can be referred to for understanding; hence, the description thereof will be omitted.

Figure 5:
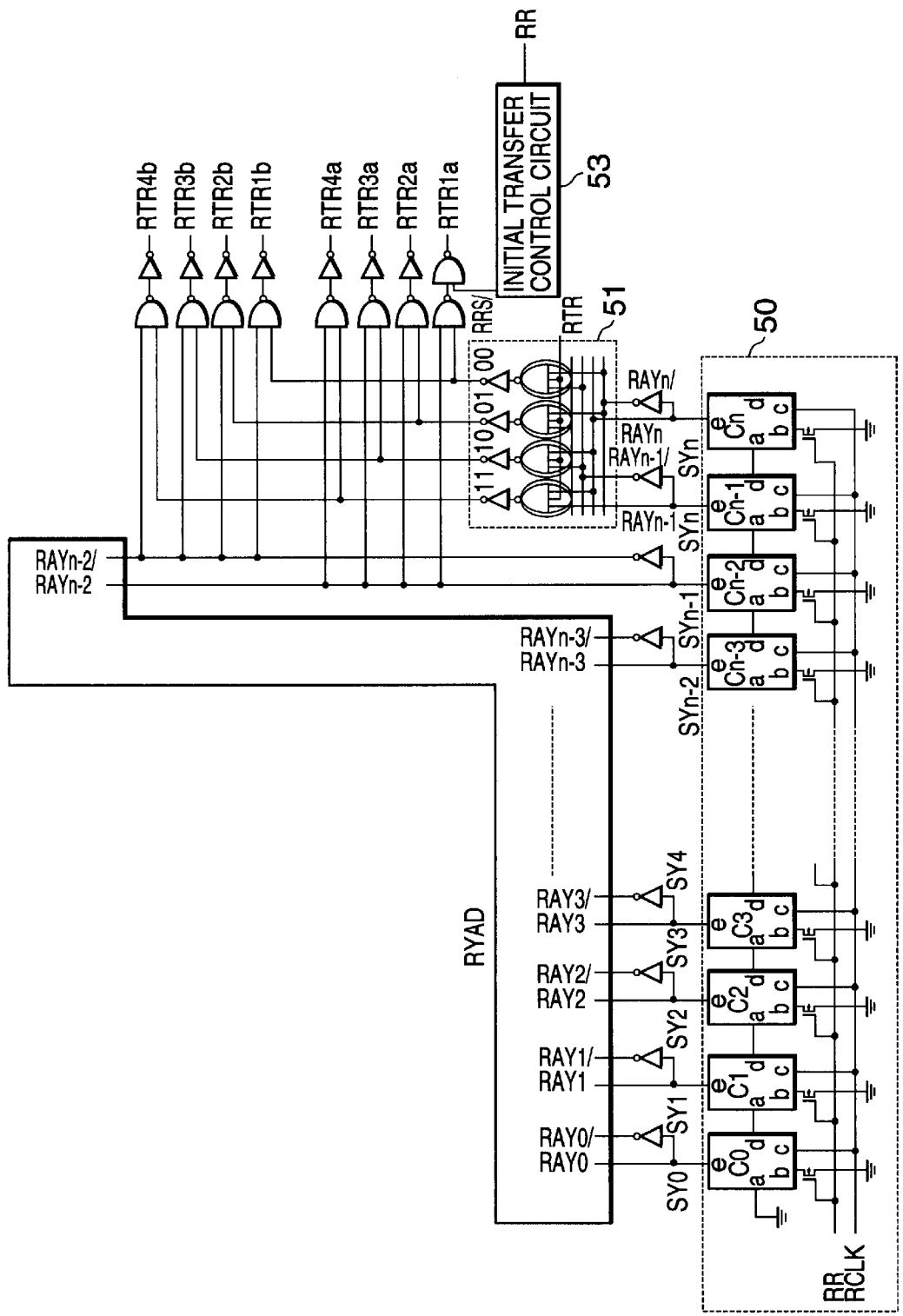
FIG. 5 is a circuit diagram showing a read address generating circuit.
Figure 6:
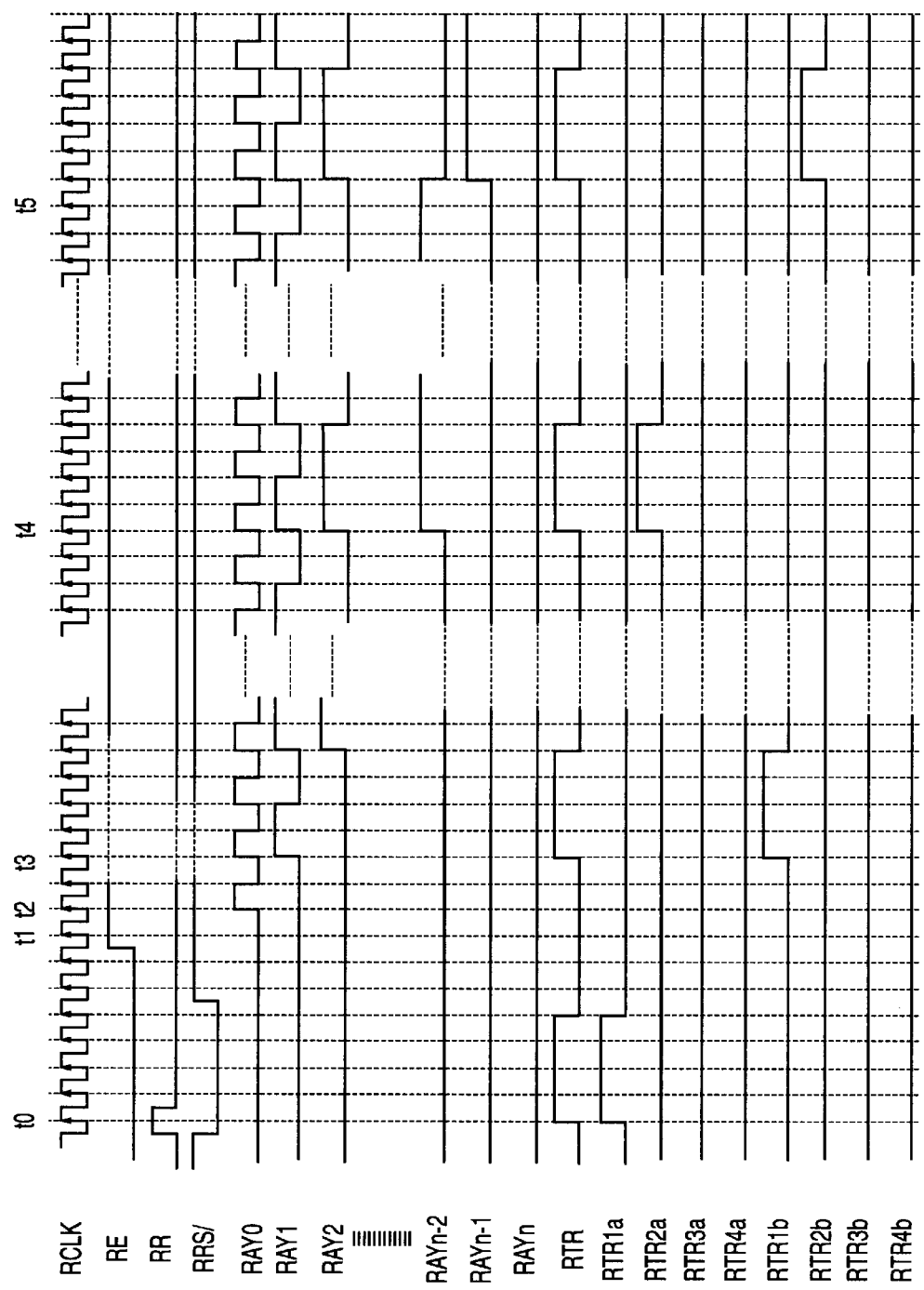
FIG. 6 is a timing chart illustrating an operation of the read address generating circuit.

A circuit for generating the read transfer signals RTR1 through RTR4 will now be described. FIG. 5 is a circuit diagram showing a read address generating circuit for generating the read Y address RYAD and the read transfer signals RTR1 through RTR4 (read transfer signals RTR1a through RTR4a for the first bank and read transfer signals RTR1b through RTR4b for the second bank in this case). FIG. 6 is a timing chart illustrating an operation of the read address generating circuit.

The read address generating circuit is constituted by a shift register 50, a first decoder 51, a second decoder 52, and an initial transfer control circuit 53.

The shift register 50 has n+1 flip-flops C0 to Cn. A read clock signal RCLK is applied to a clock input terminal c of the flip-flops C0 to Cn. A first terminal of an NMOS transistor is connected to a reset terminal of the flip-flops C0 to Cn. A second terminal of the NMOS transistor is grounded, and a read reset signal RR is commonly applied to a gate.

An input a of the first flip-flop C0 is grounded, while an output d is connected to an input of a second flip-flop C1. An output signal from another output e of the first flip-flop C0 and its inverted signal turn into address signals RAY0 and RAY0/ constituting a part of the read Y address RYAD.

The output d of the second flip-flop C1 is connected to an input of the third flip-flop C2. An output signal from another output e of the second flip-flop C1 and its inverted signal turn into address signals RAY1 and RAY1/ constituting a part of the read Y address RYAD.

The same connection relationship applies to an n-th flip-flops. The read Y addresses RYAD include address signals RAY1 to n−2 and RAY1 to n−2/. Address signals RAYn−1, RAYn−1/, RAYn, and RAYn/ are used to generate read transfer signals RTR1a to RTR4b.

The first decoder 51 is constituted of NAND circuits. A first NAND circuit receives the address signals RAYn−1 and RAYn, and a read transfer signal RTR, and its output is inverted by an inverter to turn into a signal 11. A second NAND circuit receives the address signals RAYn−1/ and RAYn, and the read transfer signal RTR, and its output is inverted by the inverter to turn into a signal 10. A third NAND circuit receives the address signals RAYn−1 and RAYn/, and the read transfer signal RTR, and its output is inverted by the inverter to turn into a signal 01. A fourth NAND circuit receives the address signals RAYn−1/ and RAYn/, and the read transfer signal RTR, and its output is inverted by the inverter to turn into a signal 00.

The second decoder 52 is also comprised of NAND circuits. A first NAND circuit receives the output signal 00 of the first decoder 51 and an address signal RAYn−2. A non-disjunction operation of an output of the first NAND circuit and an output signal RRS/ of the initial transfer control circuit is performed to provide a read transfer signal RTR1a of a first bank. A second NAND circuit receives the output signal 01 of the first decoder 51 and the address signal RAYn−2, and its output is inverted by the inverter to turn into a read transfer signal RTR2a of the first bank. A third NAND circuit receives the output signal 10 of the first decoder 51 and the address signal RAYn−2, and its output is inverted by the inverter to turn into a read transfer signal RTR3a of the first bank. A fourth NAND circuit receives the output signal 11 of the first decoder 51 and the address signal RAYn−2, and its output is inverted by the inverter to turn into a read transfer signal RTR4a of the first bank. A fifth NAND circuit receives the output signal 00 of the first decoder 51 and the address signal RAYn−2/, and its output is inverted by the inverter to turn into a read transfer signal RTR1b of the second bank. A sixth NAND circuit receives the output signal 01 of the first decoder 51 and the address signal RAYn−2/, and its output is inverted by the inverter to turn into a read transfer signal RTR2b of the second bank. A seventh NAND circuit receives the output signal 10 of the first decoder 51 and the address signal RAYn−2/, and its output is inverted by the inverter to turn into a read transfer signal RTR3b of the second bank. An eighth NAND circuit receives the output signal 11 of the first decoder 51 and the address signal RAYn−2/, and its output is inverted by the inverter to turn into a read transfer signal RTR4b of the second bank.

The initial transfer control circuit is provided to adjust an initial condition of a read transfer, and receives a read reset signal, and outputs, in response to the read reset signal, a signal RRS/ that stays in an activated state for a slightly longer period of time than the read transfer signal RTR.

FIG. 6 is the timing chart illustrating an operation of the read address generating circuit shown in FIG. 5.

At time t0 at which the read clock signal RCLK rises, the read reset signal RR is switched to the high level. At this time, the read enable signal RE remains at the low level, and the output signal RRS/ of the initial transfer circuit is at the low level in response to the read reset signal RR. Furthermore, the read transfer signal RTR is switched to the high level, so that the read transfer signal RTR1a of the first bank is also switched to the high level. Thereafter, when the read transfer signal RTR is switched to the low level, the read transfer signal RTR1a of the first bank is also switched to the low level, then the output signal RRS/ of the initial transfer circuit is switched to the high level.

At time t1 at which the read clock signal RCLK rises first after the read reset signal RR rises, the generation of the address signals is started.

Then, at time t2 when the read clock signal RCLK rises, an address signal RAY0 is switched to the high level. Furthermore, at time t3 when the read clock signal RCLK rises, the address signal RAY0 is switched back to the high level, and an address signal RAY2 is switched to the high level. At this time, the read transfer signal RTR is also set at the high level, so that the read transfer signal RTR1b of the second bank is also set at the high level.

For the address signals RAY0 to RAYn, the read clock signal RCLK is divided in sequence; hence, the description thereof will be omitted.

At time t4, the read transfer signal RTR and the address signal RAYn−2 are switched to the high level, while the address signals RAYn−1 and RAYn remain at the low level. This causes the read transfer signal RTR2a of the first bank to be switched to the high level. At time t5, the read transfer signal RTR and the address signal RAYn−1 are switched to the high level, while the address signal RAYn−2 and RAYn are switched to the low level. This causes the read transfer signal RTR2b of the second bank to be switched to the high level. Regarding the remaining read transfer signals RTR3a through RTR4b, a logic can be referred to for understanding; hence, the description thereof will be omitted.

Figure 7:
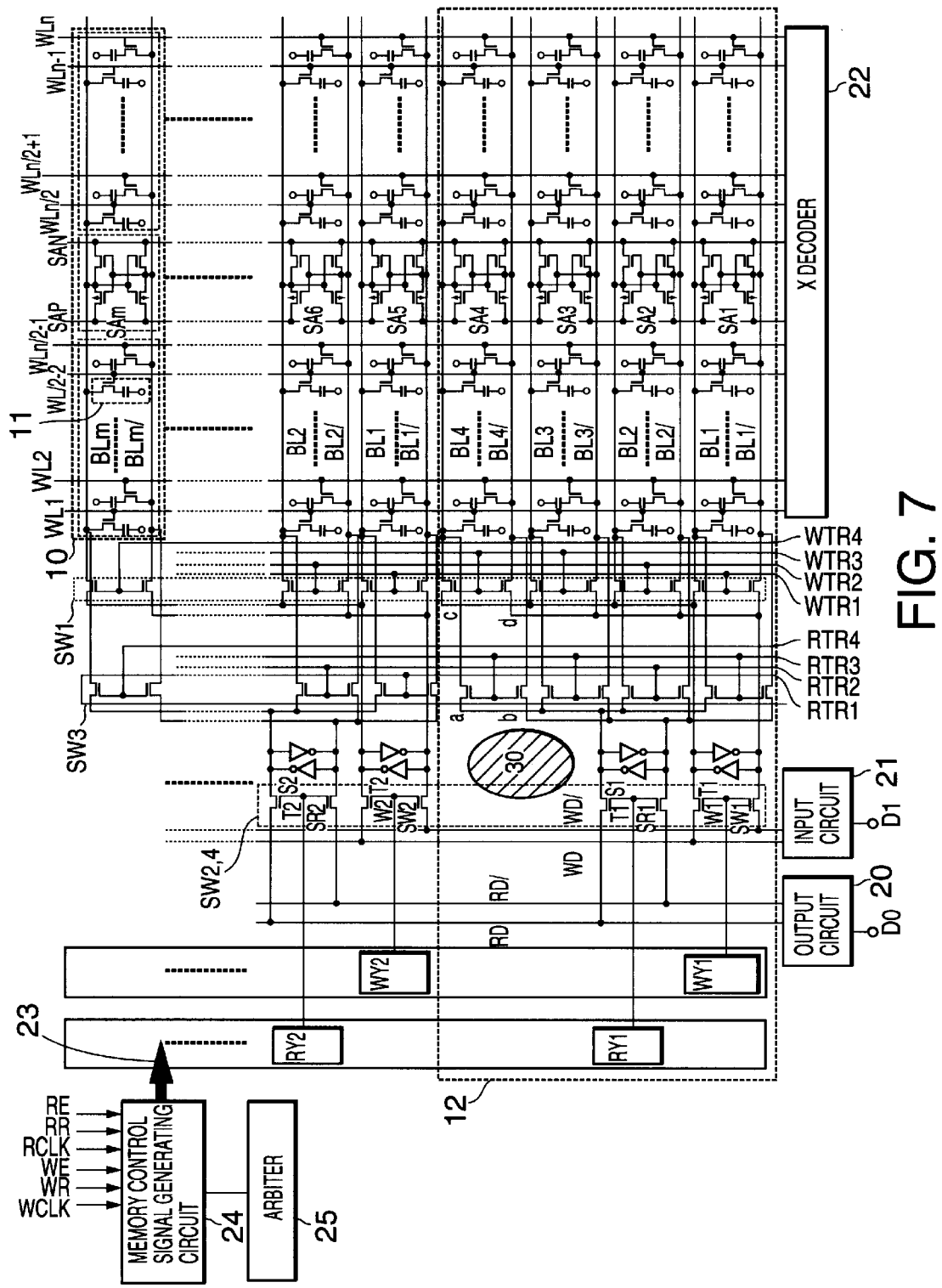
FIG. 7 is a fragmentary circuit diagram showing a serial access memory according to a second embodiment of the present invention.

FIG. 7 is a fragmentary circuit diagram of a serial access memory according to a second embodiment of the present invention. Like components as those of the first embodiment will be assigned like reference numerals, and the descriptions thereof will not be repeated.

The serial access memory according to the second embodiment has exactly the same circuit configuration as that of the first embodiment except for a layout of the circuit.

In the serial access memory according to the first embodiment, the write Y decoders WY1, WY2 and so on and the write registers T1, T2 and so on are connected to one end of the memory column 10, while the read Y decoders RY1, RY2 and so on and the read registers S1, S2 and so on are connected to the other end of the memory column 10. In the serial access memory according to the second embodiment, the write Y decoders WY1, WY2 and so on, the write registers T1, T2 and so on, the read Y decoders RY1, RY2 and so on, and the read registers S1, S2 and so on are connected to the same one end.

Since the circuit configuration of the serial access memory according to the second embodiment is the same as the serial access memory according to the first embodiment, the operation thereof is also the same. Therefore, the description of the operation of the serial access memory according to the second embodiment will be omitted.

Because of the connection relationship mentioned above, the write registers T1, T2 and so on, and the read registers S1, S2 and so on are installed adjacently to each other. Hence, an area for a pattern design is smaller than that in the first embodiment; however, the chip area can be reduced accordingly with consequent reduction in manufacturing cost.

Figure 8:
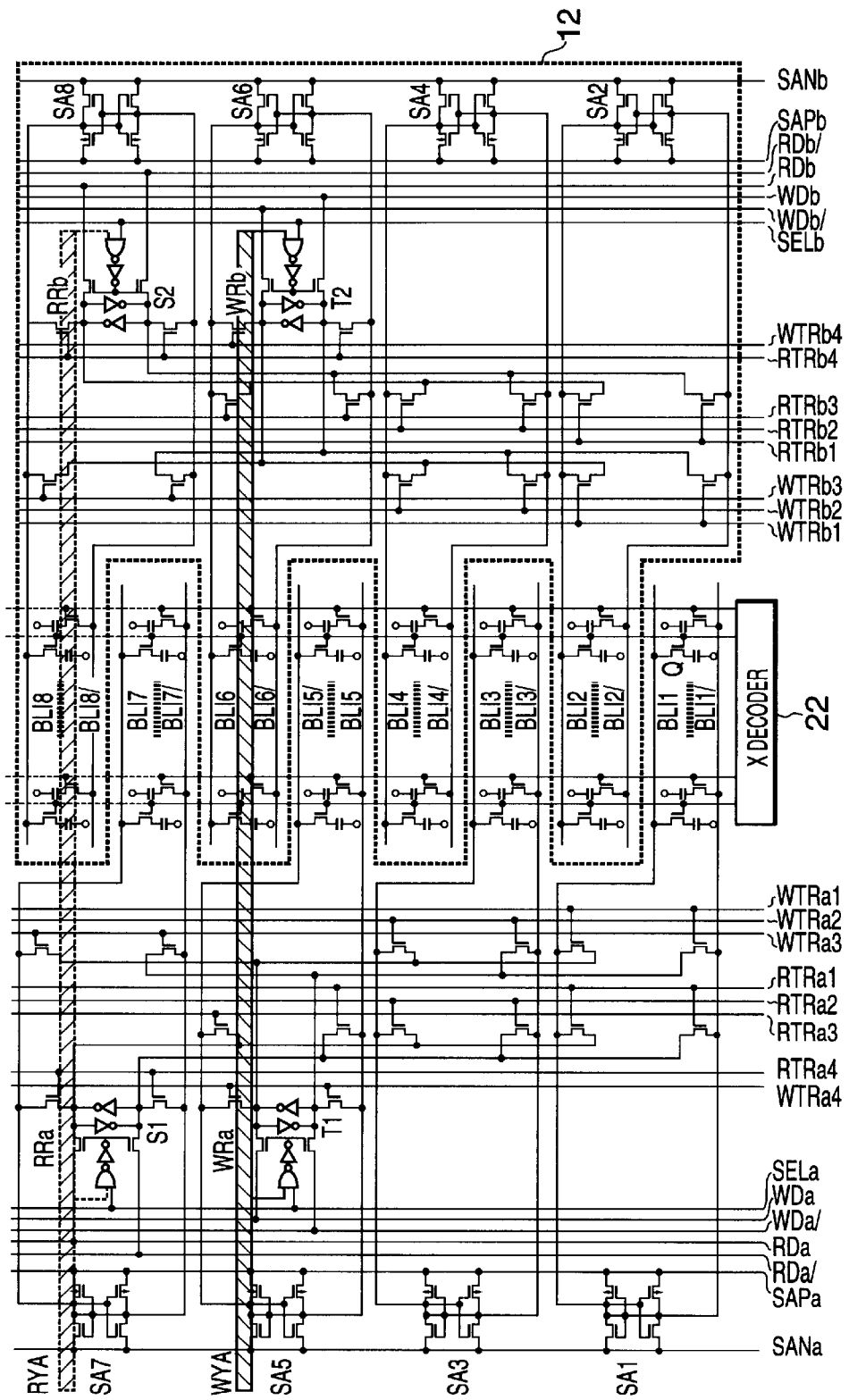
FIG. 8 is a fragmentary circuit diagram showing a serial access memory according to a third embodiment of the present invention.

FIG. 8 is a fragmentary circuit diagram showing a serial access memory according to a third embodiment in accordance with the present invention. Like components as those of the first embodiment will be assigned like reference numerals, and the description thereof will not be repeated.

In the serial access memory according to the third embodiment, write registers T1, T2 and so on, and read registers S1, S2 and so on are connected to the same one end of the memory columns 10 as in the case of the second embodiment.

The serial access memory according to the third embodiment is characterized in that the memory columns 10 constituting a memory column group 12 are provided with a void between adjacent ones. More specifically, pairs of bit lines BL11 and BL11/, BL13 and BL13/, BL15 and BL15/, and BL17 and BL17/ make up one memory column group 12. In the memory column group 12, the write registers T1 and the read registers S1 are connected to one end of the memory column (the left end in the drawing). Furthermore, sense amplifiers SA1, SA3 and so on of the memory column are disposed on the outer side of the write register T1 and the read register S1.

In addition, pairs of bit lines BL12 and BL12/, BL14 and BL14/, BL16 and BL16/, and BL18 and BL18/ make up another memory column group 12. In the memory column groups 12, the write register T2 and the read register S2 are connected to the other end of the memory columns (the right end in the drawing). Furthermore, sense amplifiers SA2, SA4 and so on of the memory column are disposed on the outer side of the write register T2 and the read register S2.

In the third embodiment, write transfer signals are applied to one end of a memory column and denoted as "a", while read transfer signals are applied to the other end of the memory column and denoted as "b". Alternatively, however, sense amplifier activating signals SANa, SAPa, SANb, and SAPb, write data buses WDa, WDa/, WDb, WDb/, read data buses RDa, RDa/, RDb, RDb/, read transfer signals RTRa1 through RTRb4, and write transfer signals WRTa1 through WRTb4 may be used as the same signals or the same lines at the end without distinguishing between "a" and "b" mentioned above. It should be noted, however, the signals need to be distinguished from the signals of the first and second banks described with reference to FIGS. 3 through 6. As previously mentioned, the first and second banks can be independently operated. In the third embodiment, however, the circuit layout in the same bank is a major concern. Hence, the same signals as those of the first embodiment can be employed.

In the third embodiment, selection signals SELa and SELb have been added. The selection signals SELa and SELb decides whether end "a" (the right end in the drawing) or side "b" (the left end in the drawing) should be accessed. Selection of the write register T1 or T2 is performed based on a logical product of a write Y address WYA commonly received and the selection signals SELa and SELb. Likewise, selection of the read register S1 or S2 is performed based on a logical product of a read Y address RYA commonly received and the selection signals SELa and SELb.

The operation of the serial access memory according to the third embodiment is identical to that of the serial access memory according to the first embodiment; therefore, the description thereof will be omitted.

In the third embodiment, a sense amplifier can be formed at a pitch for two memory columns, allowing the memory column pitch to be reduced. Moreover, the write registers and the read registers can be formed at a pitch twice as large as that of the memory column groups 12, so that the registers can be formed with an allowance that is double the allowance in the second embodiment. Thus, a chip area can be reduced, making it possible to provide a serial access memory with lower cost.

Figure 9:
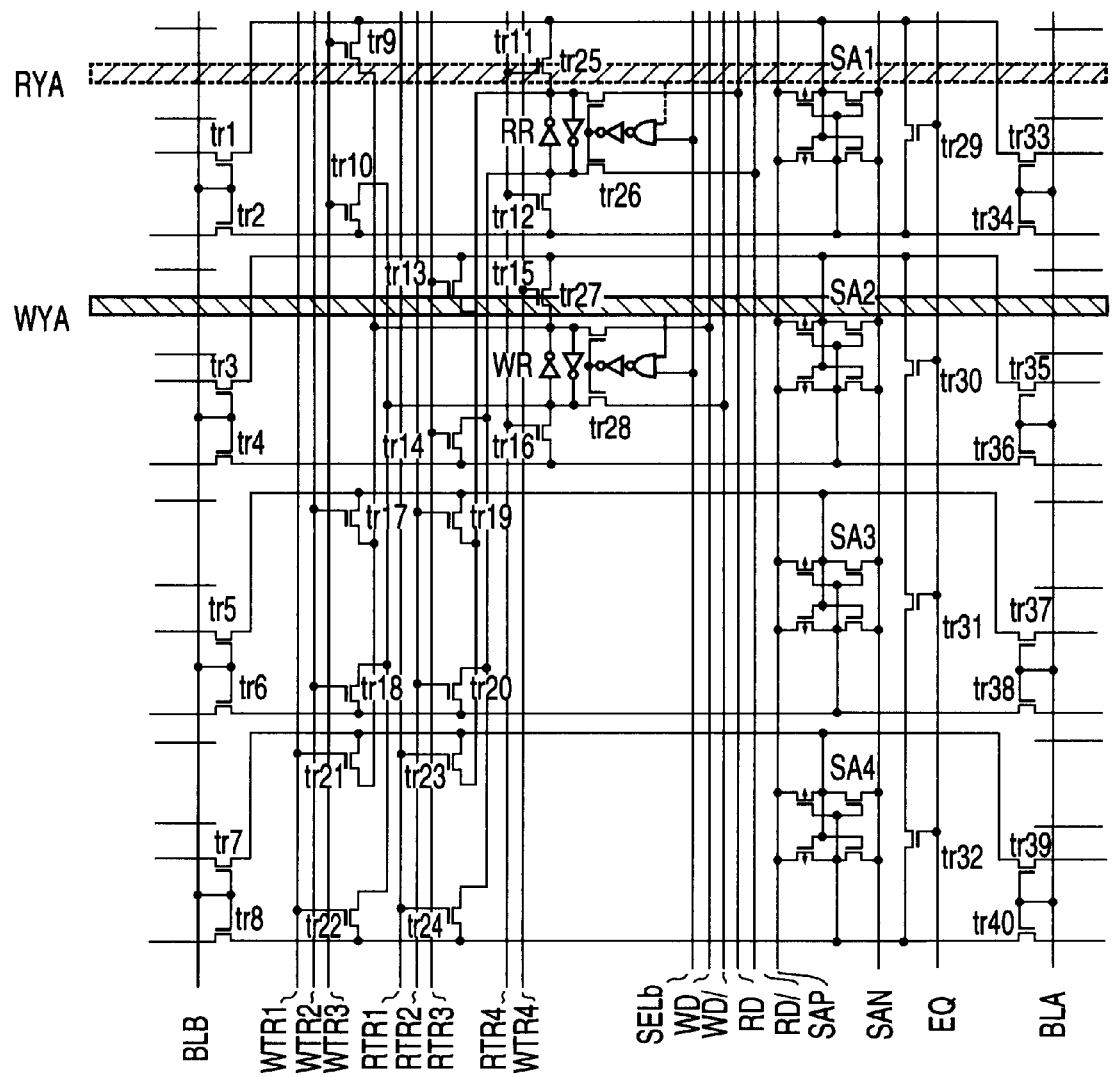
FIG. 9 is a fragmentary circuit diagram showing a serial access memory according to a fourth embodiment of the present invention.
Figure 10:
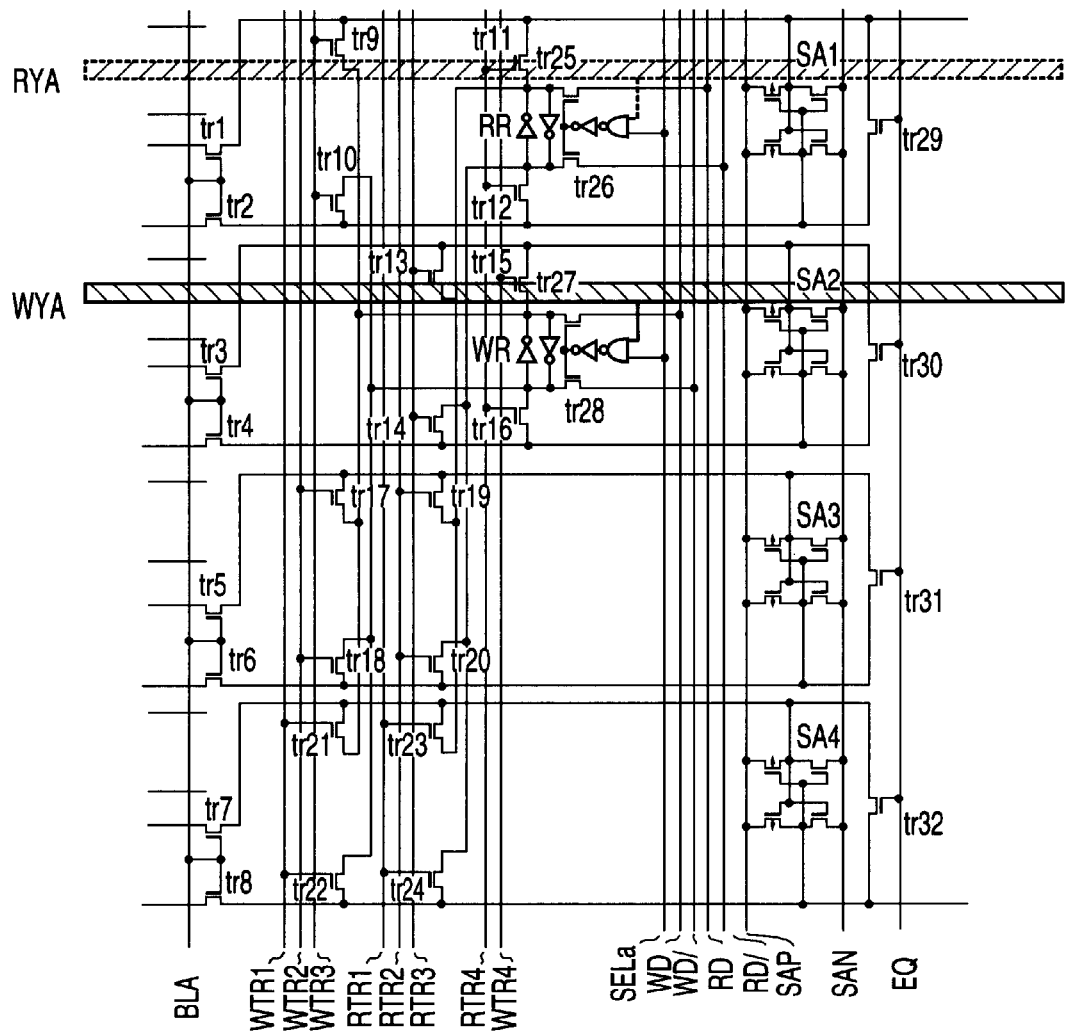
FIG. 10 is another fragmentary circuit diagram of the serial access memory according to the fourth embodiment of the present invention.

FIGS. 9 and 10 are fragmentary circuit diagrams showing a serial access memory of a fourth embodiment. Like components as those of the third embodiment will be assigned like reference numerals, and the description thereof will be omitted.

In the serial access memory according to the fourth embodiment, as in the case of the third embodiment, the memory columns 10 constituting a memory column group are provided with a void between adjacent ones, and write registers T1, T2 and so on, and read registers S1, S2 and so on are connected on the same one end of the memory columns 10.

The serial access memory according to the fourth embodiment is characterized in that a plurality of arrays of the memory columns 10 constituting memory column groups 12 are longitudinally arranged, and sense amplifiers SA1 through SA4, the read register S1, and the write register T1 are provided between adjacent arrays as shown in FIG. 9.

The sense amplifiers SA1 through SA4, the read register S1, and the write register T1 provided between adjacent memory column arrays are selectively connected to the memory columns 10 on both ends. More specifically, the sense amplifiers SA1 through SA4, the read register S1 and the write register T1 are connected to memory columns (not shown) on one end (the right end in the drawing) via transfer transistors tr33 through 40. Furthermore, the sense amplifiers SA1 through SA4, the read register S1 and the write register T1 are also connected to memory columns (not shown) on the other end (the left end in the drawing) via transfer transistors tr1 through tr8. The transfer transistors tr1 through tr8 are controlled to be turned ON/OFF by a bit line pair selection signal BLB. The transfer transistors tr33 through tr40 are controlled to be turned ON/OFF by a bit line pair selection signal BLA. In the fourth embodiment, transistors tr29 through tr32 for equalizing bit lines are provided for respective bit line pairs. The transistors tr29 through tr32 equalize the bit line pairs in response to an equalizing signal EQ.

FIG. 10 shows a circuit diagram showing a portion at one end of a memory column array of the serial access memory according to the fourth embodiment. Hence, the portion of FIG. 10 is connected to the right end of the circuit shown in FIG. 9. It is needless to say that memory columns exist (two arrays of memory columns exist in some cases, and the circuit shown in FIG. 9 exists at a middle thereof in some cases) between the circuit shown in FIG. 9 and the circuit shown in FIG. 10. The sense amplifiers SA1 through SA4, the read register S1, and the write register T1 shown in FIG. 10 are also connected to the memory columns (not shown) on the other end (the left end in the drawing) via the transfer transistors tr1 through tr8. The transfer transistors tr1 through tr8 are controlled to be turned ON/OFF by a bit line pair selection signal BLA. As in the case of the circuit shown in FIG. 9, the transistors tr29 through tr32 equalize the bit line pairs in response to the equalizing signal EQ.

In the fourth embodiment, sense amplifiers, a read register, and a write register connected to the left end of the circuit shown in FIG. 9 via memory columns exist although they are not disclosed in FIGS. 9 and 10. The circuit is configured so that it is laterally symmetrical to the circuit of FIG. 10. Signals supplied to the circuit are the same as those supplied to the circuit of FIG. 10 except that a bit line pair selection signal BLB is supplied to the transfer transistors Tr1 through Tr8, and a selection signal SELb is supplied to the read register and the write register.

An operation of the serial access memory according to the fourth embodiment will now be described. The description of the operation will be given of a serial access memory in which the circuit shown in FIG. 10 is connected via a first array of memory columns to the right end of the circuit shown in FIG. 9, and the circuit laterally symmetrical to the circuit of FIG. 10 as described above is connected via a second array of memory columns to the left end of the circuit shown in FIG. 9.

First, the bit line pair selection signal BLA is set at the high level, while the bit line pair selection signal BLB is set at the low level. This turns on the transfer transistors tr33 through tr40 shown in FIG. 9 and the transfer transistors tr1 through tr8 shown in FIG. 10. Hence, the sense amplifiers SA1 through SA4 shown in FIG. 9 and the sense amplifiers SA1 through SA4 shown in FIG. 10 are connected to the first array of memory columns located between the circuit shown in FIG. 9 and the circuit shown in FIG. 10 (located at the right end in FIG. 9). The operation thereafter is the same as that of the third embodiment, and the description thereof will be omitted.

Next, the bit line pair selection signal BLA is set at the low level, while the bit line pair selection signal BLB is set at the high level. This turns on the transfer transistors tr1 through tr8 shown in FIG. 9 and the transfer transistors tr1 through tr8 in the circuit which is laterally symmetrical to the circuit shown in FIG. 10. Hence, the sense amplifiers SA1 through SA4 shown in FIG. 9 and the sense amplifiers SA1 through SA4 in the circuit laterally symmetrical to the circuit shown in FIG. 10 are connected to the second array of memory columns located between the circuit shown in FIG. 9 and the circuit laterally symmetrical to the circuit shown in FIG. 10 (located at the left end in FIG. 9). The operation thereafter is the same as that of the third embodiment, and the description thereof will be omitted.

The fourth embodiment is advantageously used for longer bit line pairs in a memory cell array. As the length of a bit line in a memory cell array increases (e.g. as the lateral dimension in FIG. 1 is extended), a parasitic capacitance to the bit line increases, undesirably resulting in a prolonged time for writing to or reading from a memory. For this reason, the fourth embodiment characterized by shorter bit lines is ideally used for a large-capacity serial access memory. Moreover, as in the case of the third embodiment, the chip area can be made smaller, and inexpensive large-capacity serial access memories can be provided.

Figure 11:
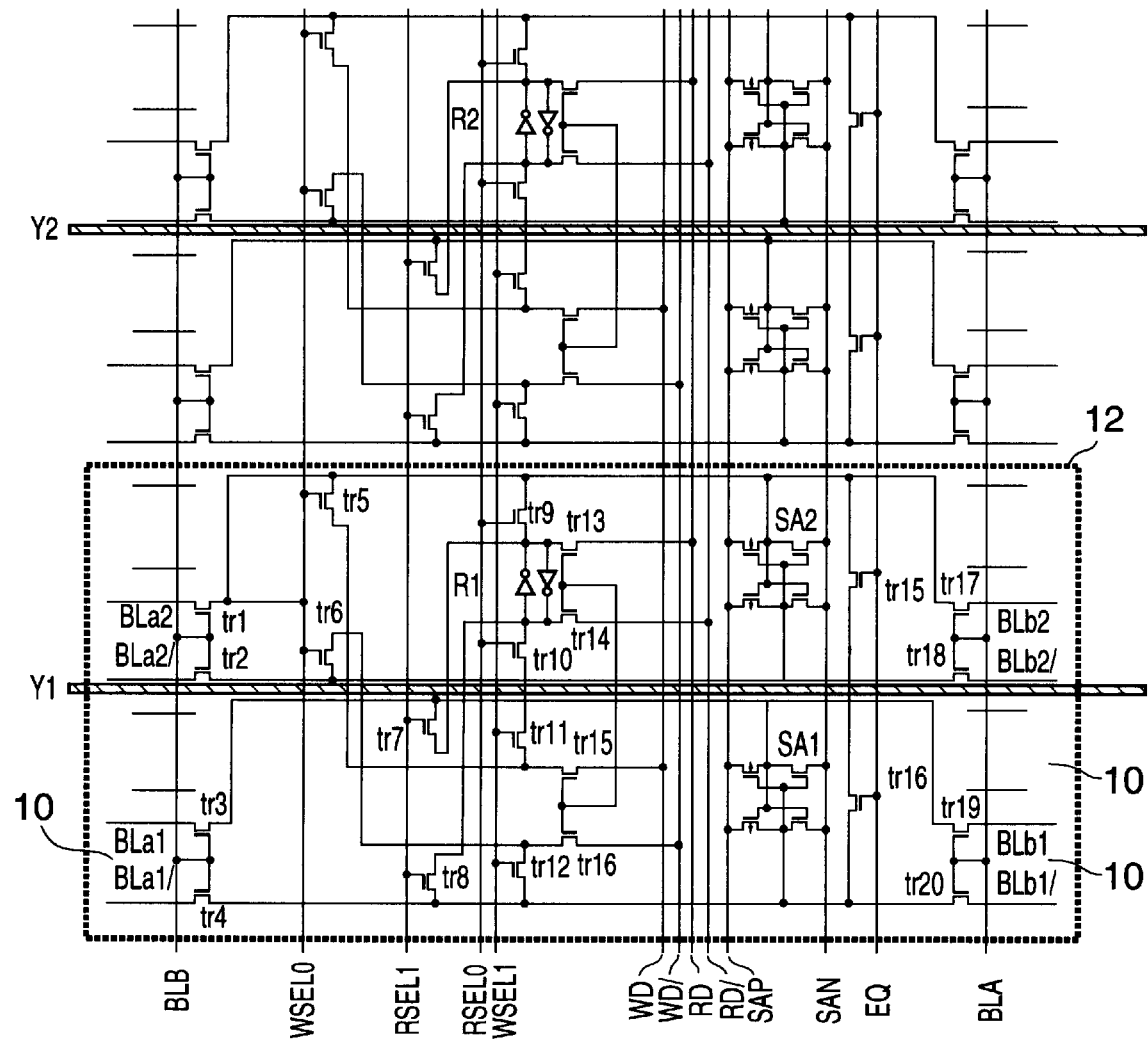
FIG. 11 is a fragmentary circuit diagram showing a serial access memory according to a fifth embodiment of the present invention.
Figure 12:
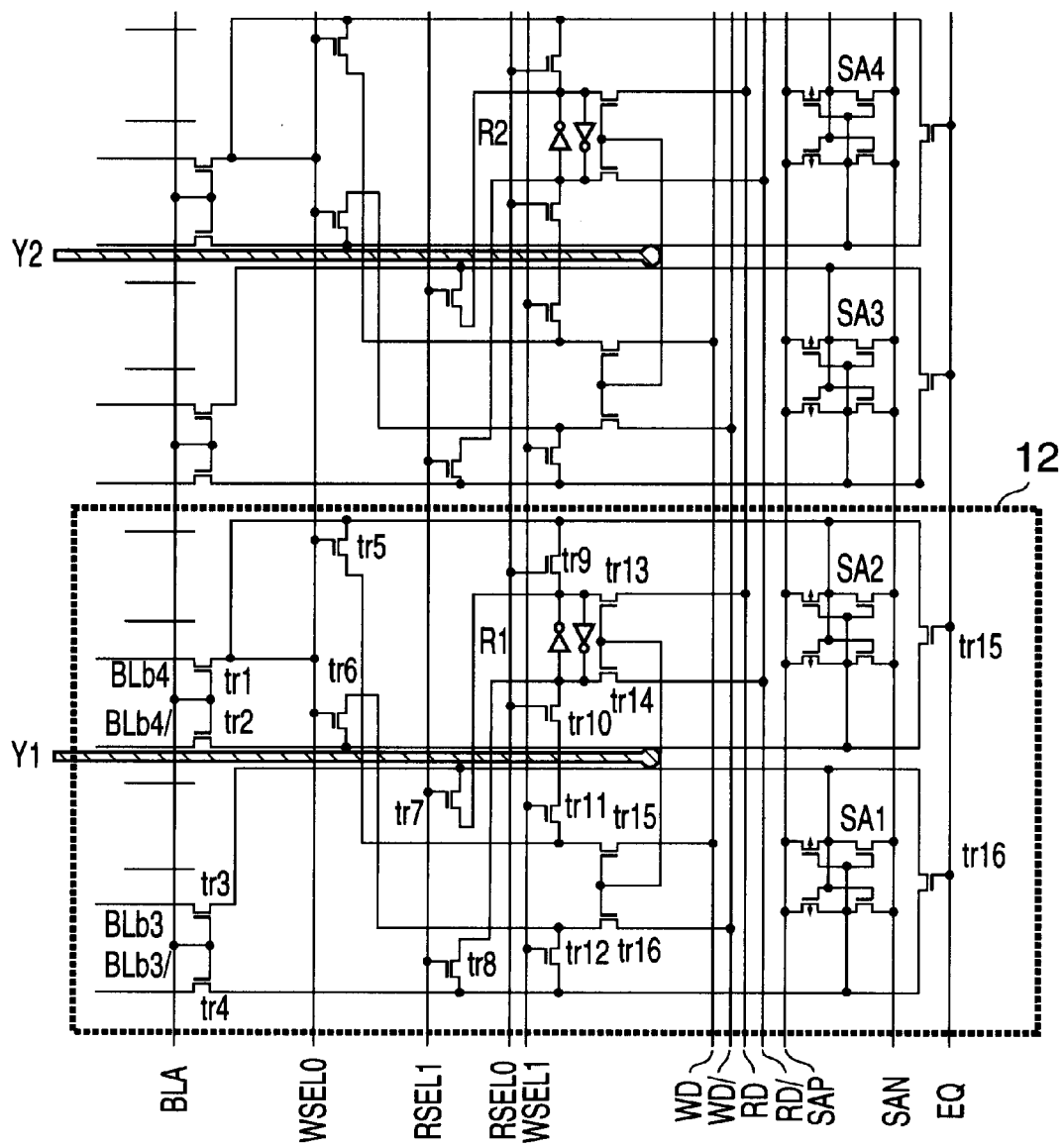
FIG. 12 is another fragmentary circuit of the serial access memory according to the fifth embodiment of the present invention.

FIGS. 11 and 12 are fragmentary circuit diagrams showing a serial access memory according to a fifth embodiment of the present invention. Like components as those of the fourth embodiment will be assigned the same reference numerals, and the description thereof will be omitted.

In the serial access memory according to the fifth embodiment, a plurality of arrays of memory columns 10 constituting a memory column group 12 are longitudinally arranged, and sense amplifiers SA1 through SA4 and a read register S1 are provided between adjacent arrays, as in the case of the fourth embodiment. The serial access memory according to the fifth embodiment has the read register, while it has no write register. Therefore, information is directly written to a memory cell. Furthermore, in the serial access memory according to the fifth embodiment, the memory column group 12 is formed of two memory columns.

The following will describe a configuration of the serial access memory according to the fifth embodiment, focusing mainly on different aspects from the configuration of the fourth embodiment. The circuit shown in FIGS. 11 and 12 has the same layout as that of the third embodiment shown in FIGS. 9 and 10. More specifically, the sense amplifiers SA1, SA2, and the read register S1 shown in FIG. 11 are connected to memory columns 10, not shown, (bit line pairs BLa1, BLa1/, BLa2, and BLa2/) on one end (the left end in the drawing) via transfer transistors tr1 through tr4. The sense amplifiers SA1, SA2, and the read register SI are also connected to memory columns, not shown, (bit line pairs BLb1, BLb1/, BLb2, and BLb2/) on the other end (the right end in the drawing) via transfer transistors tr17 through tr20. The transfer transistors tr1 through tr4 are controlled to be turned ON/OFF by a bit line pair selection signal BLB. The transfer transistors tr17 through tr20 are controlled to be turned ON/OFF by a bit line pair selection signal BLA. In the fourth embodiment, write data bus pairs WD and WD/ are connected to bit lines via transfer transistors tr15, tr16, tr5, tr6, tr11, and tr12. Likewise, read data bus pairs RD and RD/ are connected to the read register S1 via transfer transistors tr13 and tr14. The read register S1 is connected to the bit lines via transfer transistors tr7 through tr10.

The transfer transistors tr13 through tr16 are commonly controlled to be turned ON/OFF by a Y decoder output signal Y1. The transfer transistors tr5 and tr6 are controlled to be turned ON/OFF by a write selection signal WSEL0, the transfer transistors tr11 and tr12 are controlled to be turned ON/OFF by a write selection signal WSEL1, the transfer transistors tr9 and tr10 are controlled to be turned ON/OFF by a read selection signal RSEL0, and the transfer transistors tr7 and tr8 are controlled to be turned ON/OFF by a read selection signal RSEL1.

In the circuit shown in FIG. 12, the description of the same portion as that of the circuit shown in FIG. 11 will be omitted. The circuit of FIG. 12 does not have components corresponding to the transfer transistors tr17 through tr20. Furthermore, bit line pairs BLb3, BLb3/, BLb4, and BLb4/ are connected to the transfer transistors tr1 through tr4.

As in the case of the fourth embodiment, sense amplifiers and a read register connected to the left end of the circuit shown in FIG. 9 via memory columns exist although they are not disclosed in FIGS. 11 and 12. The circuit is configured so that it is laterally symmetrical to the circuit of FIG. 12. Signals supplied to the circuit are the same as those supplied to the circuit of FIG. 12 except that a bit line pair selection signal BLB is supplied to the transfer transistors Tr1 through Tr4.

An operation of the serial access memory according to the fifth embodiment will now be described. The description of the operation will be given of a serial access memory in which the circuit shown in FIG. 12 is connected via a first array of memory columns to the right end of the circuit shown in FIG. 11, and the circuit laterally symmetrical to the circuit of FIG. 12 as described above is connected via a second array of memory columns to the left end of the circuit shown in FIG. 11.

First, the bit line pair selection signal BLA is set at the high level, while the bit line pair selection signal BLB is set at the low level. This turns on the transfer transistors tr17 through tr20 shown in FIG. 11 and the transfer transistors tr1 through tr4 shown in FIG. 12. Hence, the sense amplifiers SA1 and SA2 shown in FIG. 11 and the sense amplifiers SA1 and SA2 shown in FIG. 12 are connected to the first array of memory columns located between the circuit shown in FIG. 11 and the circuit shown in FIG. 12 (located at the right end in FIG. 11).

Thereafter, if writing is performed, then an output signal Y1 of a Y decoder is switched to the high level, and the write selection signal SEL0 is switched to the high level, while the write selection signal SEL1 is switched to the low level. This causes the write data buses WD and WD/ and the bit lines BL2b and BL2b/ to be connected. Thus, data on the write data buses WD and WD/ is directly written to memory cells connected to the bit lines BL2b and BL2b/.

Regarding a reading operation, bit lines are selected in the same manner as in the writing operation described above, and the rest of the operation is identical to that of the third embodiment; therefore, the description thereof will be omitted.

Next, the bit line pair selection signal BLA is set at the low level, while the bit line pair selection signal BLB is set at the high level. This turns on the transfer transistors tr1 through tr8 shown in FIG. 11 and the transfer transistors tr1 through tr8 in the circuit which is laterally symmetrical to the circuit shown in FIG. 12. Hence, the sense amplifiers SA1 and SA2 shown in FIG. 11 and the sense amplifiers SA1 through SA4 in the circuit laterally symmetrical to the circuit shown in FIG. 12 are connected to the second array of memory columns located between the circuit shown in FIG. 11 and the circuit laterally symmetrical to the circuit shown in FIG. 12 (located at the left end in FIG. 11). The operation thereafter is the same as that of the reading operation and the writing operation, and the description thereof will be omitted.

Figure 13:
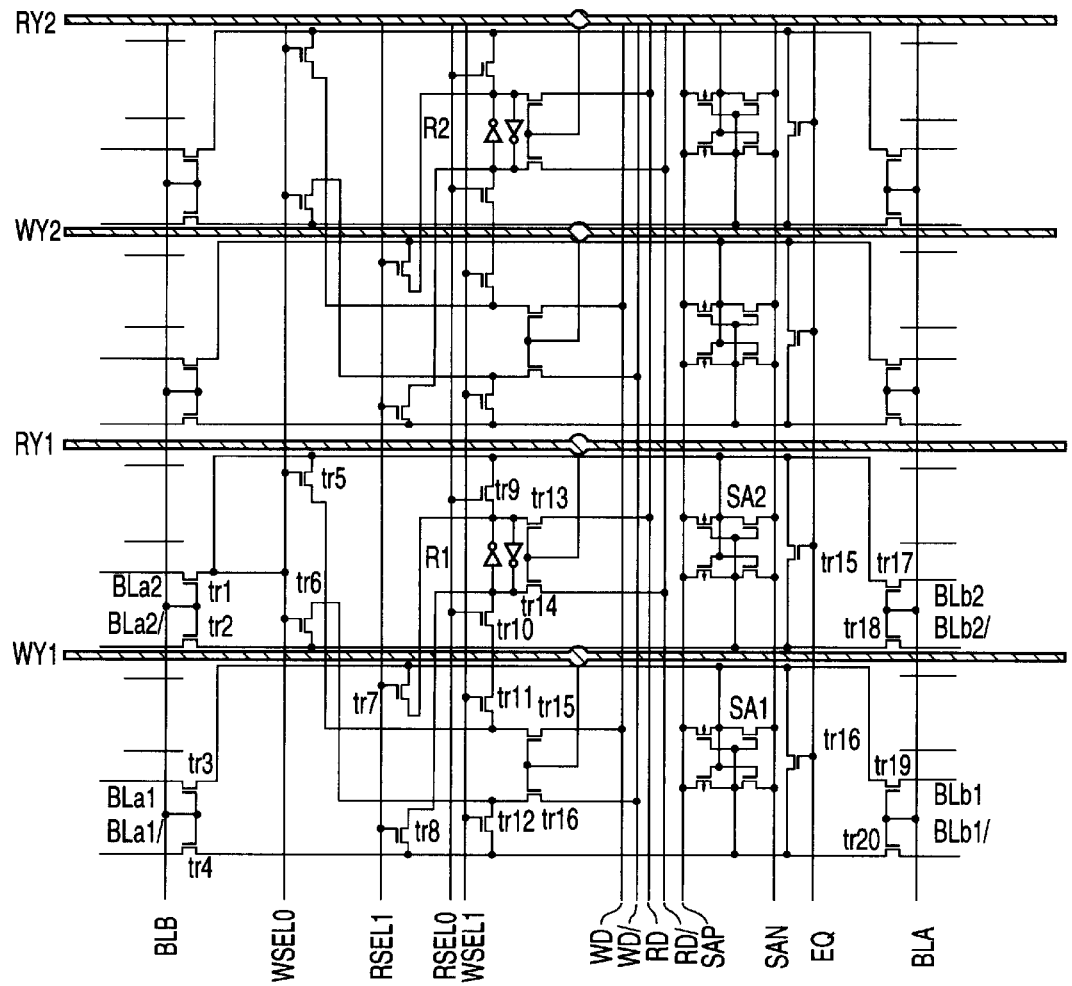
FIG. 13 is a fragmentary circuit diagram showing a serial access memory that is a modification example of the fifth embodiment.
Figure 14:
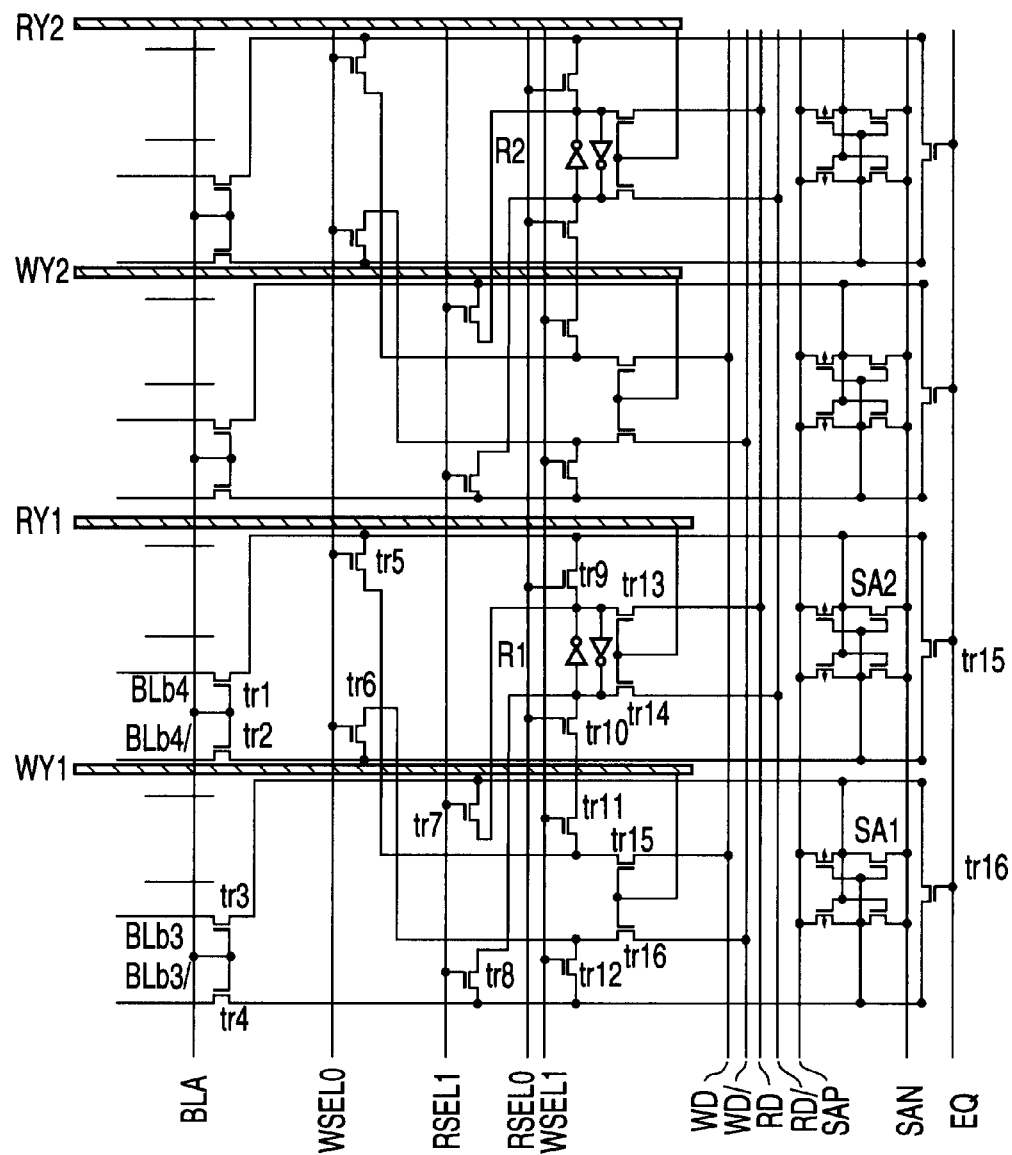
FIG. 14 is another fragmentary circuit diagram showing a serial access memory that is the modification example of the fifth embodiment.

FIGS. 13 and 14 are fragmentary circuit diagrams showing a serial access memory that is a modification example of the fifth embodiment. Like components as those of the fifth embodiment will be assigned like reference numerals, and the description thereof will be omitted.

In the serial access memory, which is the modification example of the fifth embodiment, the Y decoder output signal Y1 used for both reading and writing in the fifth embodiment has been separated to a Y decoder output signal RY1 for reading and a decoder output signal WY1 for writing. Thus, the Y decoder output signal RY1 for reading is applied to transfer transistors tr13 and tr14, and the decoder output signal WY1 for writing is applied to transfer transistors tr15 and tr16.

Except the above aspects, a circuit configuration and an operation of the modification example are the same as those of the fifth embodiment; hence, the description thereof will not be repeated.

FIG. 15 through FIG. 18 are schematic diagrams showing more details of the operation of the serial access memory according to the first embodiment.

As described in the first embodiment, in the serial access memory according to the first embodiment, four memory columns make up a memory column group 12. Referring to FIGS. 15 through 18, memory columns in a first bank are denoted by Ca4i+1, Ca4i+2, Ca4i+3, and Ca4i+4, and memory columns in a second bank are denoted by Cb4i+1, Cb4i+2, Cb4i+3, and Cb4i+4 (i=0 to n−1). For both write access and read access, if an access begins with Ca1 (the access may be begin with any memory column, however, the access starts with Calculating for simplicity), then the access order will be as follows:

Ca1,Ca5,Ca9 . . . Ca4n−3,Cb1,Cb5,Cb9 . . . Cb4n−3,
Ca2,Ca6,Ca10 . . . Ca4n−2,Cb2,Cb6,Cb10 . . . Cb4n−2,
Ca3,Ca7,Ca11 . . . Ca4n−1,Cb3,Cb7,Cb11 . . . Cb4n−1,
Ca4,Ca8,Ca12 . . . Ca4n,Cb4,Cb8,Cb12 . . . Cb4n,

The operation will now be described in more detail step by step.

Referring back to FIG. 15, the serial access memory according to the first embodiment has a first memory bank 61 and a second memory bank 62. The first memory bank 61 has a write Y decoder 63a, a write registers T1 through Tn, a read Y decoder 64a, read registers S1 through Sn, an X decoder 22a, and memory columns Ca1 through Ca4n. The second memory bank 62 has a write Y decoder 63b, a write registers Tn+1 through T2n, a read Y decoder 64b, read registers Sn+1 through S2n, an X decoder 22b, and memory columns Cb1 through Cb4n.

Furthermore, the serial access memory according to the first embodiment has, as circuits shared by the first and second banks, an input circuit 20, an output circuit 21, a write Y address generating circuit 65 for generating write Y addresses, a read Y address generating circuit 66 for generating read Y addresses, a write X address generating circuit 67 for generating write Y addresses, and a read X address generating circuit 68 for generating read x addresses.

In this example, it is assumed that a memory address at which serial write is started is present in the memory column Ca1 designated by a word line WLai, and a memory address at which serial read is started is present in the memory column Ca4 designated by a word line WLaj.

In synchronization with a write clock signal WCLK, a series of successive serial input data indicated by black dots is input to a write data bus via the input circuit 20. The serial data on the write data bus is written in sequence to the write registers T1, T2 . . . Tn as outputs W1, W2 . . . Wn of the write Y decoder 63a are switched to the high level.

Meanwhile, the word line WLaj rises, and information in a plurality of memory cells connected to the word line WLaj is amplified by associated sense amplifiers and defined on a bit line pair to which the sense amplifiers are connected. Thereafter, the information on the memory columns Ca4, Ca8 . . . Ca4n is selectively transferred to the read registers S1, S2 . . . Sn, respectively, by a switch, namely, the switch SW4 opened and closed by a read selection transfer signal described in conjunction with the first embodiment.

At the same time, as outputs R1, R2 . . . Rn of the read Y decoder 64a are switched to the high level, the information that has been transferred to the read registers S1, S2 . . . Sn is serially output, as indicated by a series of success white dots, from the output circuit 21 via read data buses RD and RD/ in the order of S1, S2 . . . Sn in synchronization with a read clock signal RCLK.

Before the information that has been transferred to the read register Sn is output, the word line WLbj of the second bank rises, and information in a plurality of memory cells connected to the word line WLbj is amplified by associated sense amplifiers and defined on a bit line pair to which the sense amplifiers are connected. Thereafter, the information on the memory columns Cb4, Cb8 . . . Cb4n is selectively transferred to the read registers Sn+1, Sn+2 . . . S2n, respectively, by a switch, namely, the switch SW4 opened and closed by a read selection transfer signal described in conjunction with the first embodiment. The transfer allows the serial read from the read registers Sn+1, Sn+2 . . . S2n, which will be discussed with reference to FIG. 16, to be performed continuously in synchronization with the read clock signal RCLK after the serial read from the read registers S1, S2 . . . Sn.

Figure 16:
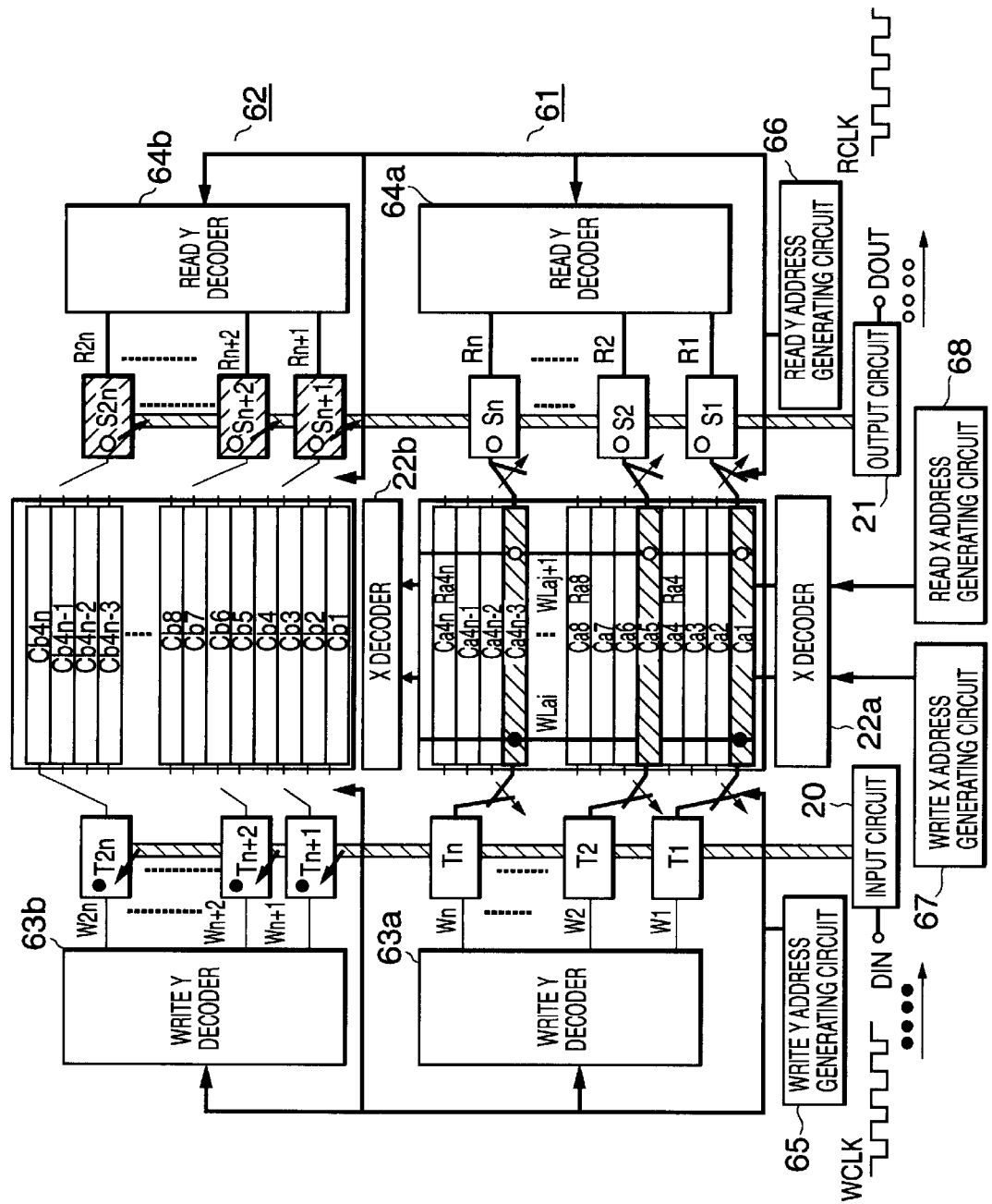
FIG. 16 is another schematic diagram showing more details of the operation of the serial access memory according to the first embodiment.

An operation that follows the foregoing operation will now be described with reference to FIG. 16.

Successively, in synchronization with the write clock signal WCLK, serial input data indicated by a series of consecutive black dots is supplied to write data buses via the input circuit 20. At this time, the serial input data is written to the write registers in the order of Tn+1, Tn+2 . . . T2n as outputs Wn+1, Wn+2 . . . W2n of the write Y decoder 63b are switched to the high level in order.

While the data is being written to the write registers Tn+1, Tn+2 . . . T2n, the word line WLai of the first bank rises. Thereafter, the information that has been written to the write registers T1, T2 . . . Tn is transferred to the memory columns Ca1, Ca5 . . . Ca4n−3 selected by a switch, namely, the switch SW2 opened and closed by a read selection transfer signal described in conjunction with the first embodiment, then written to the memory cells connected to the memory columns and the word line WLai. While the write access is being made, the information that has been selectively transferred to the read registers Sn+1, Sn+2 . . . S2n is output in synchronization with the read clock signal RCLK from the output circuit 21 via the read data buses RD and RD/, in the form of serial data denoted by a series of successive white dots.

Figure 15:
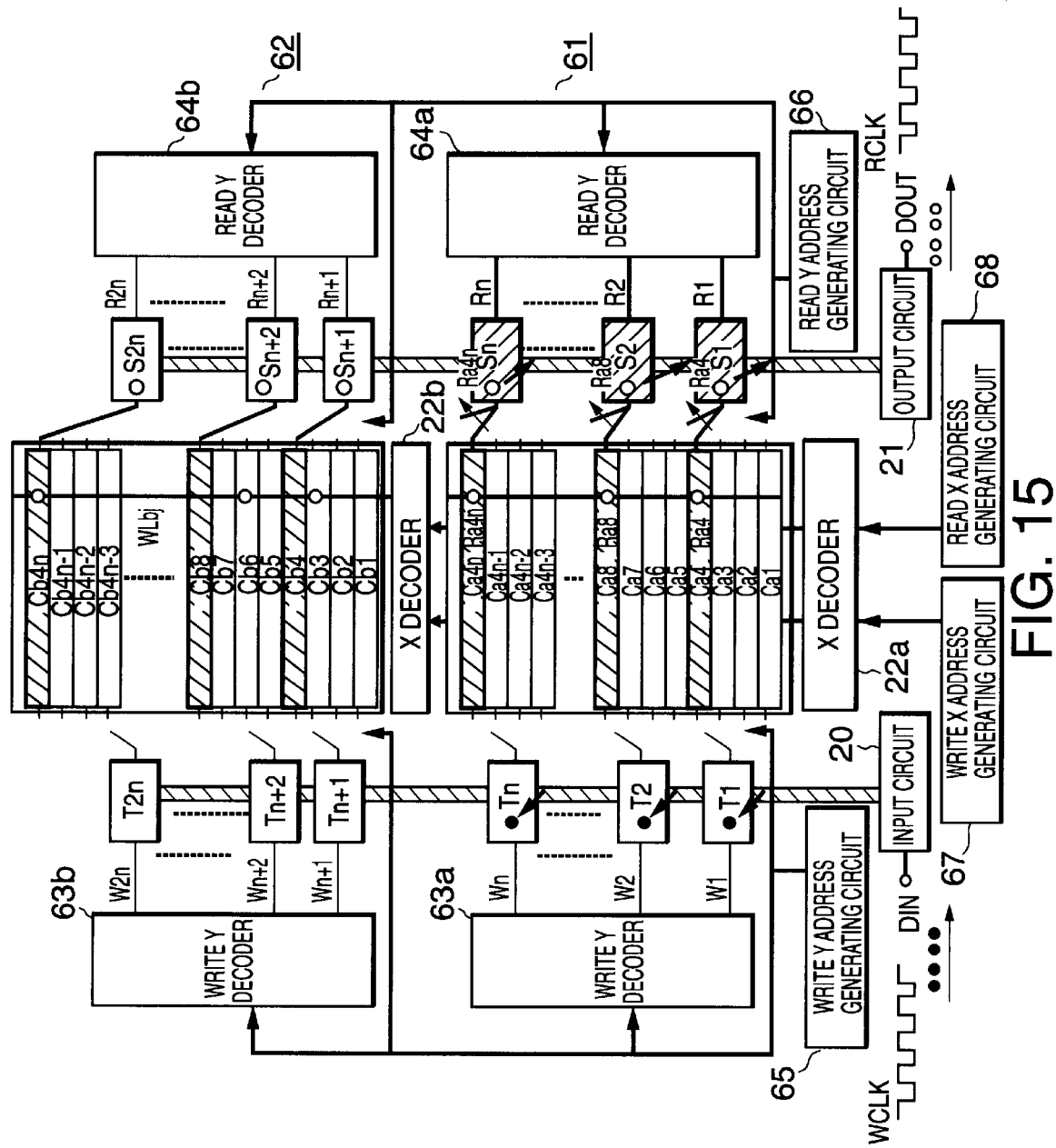
FIG. 15 is a schematic diagram showing more details of the operation of the serial access memory according to the first embodiment.

Before the information that has been transferred to the read register S2n is output, a word line WLaj+1 rises that has incremented by 1 the X address on the word line WLaj that has been risen in the first bank as described in conjunction with FIG. 15. The information in a plurality of memory cells connected to the word line WLaj+1 is amplified by their associated sense amplifiers, and defined on a bit line pair to which the sense amplifiers are connected. Thereafter, the information on the memory columns Ca1, Ca5 . . . Ca4n−3 is selectively transferred to the read registers S1, S2 . . . Sn by a switch SW4. The transfer that is performed beforehand allows the serial read from the read registers S1, S2 . . . Sn, which will be discussed with reference to FIG. 17, to be performed continuously in synchronization with the read clock signal RCLK after the serial read from the read registers Sn+1, Sn+2 . . . S2n.

Figure 17:
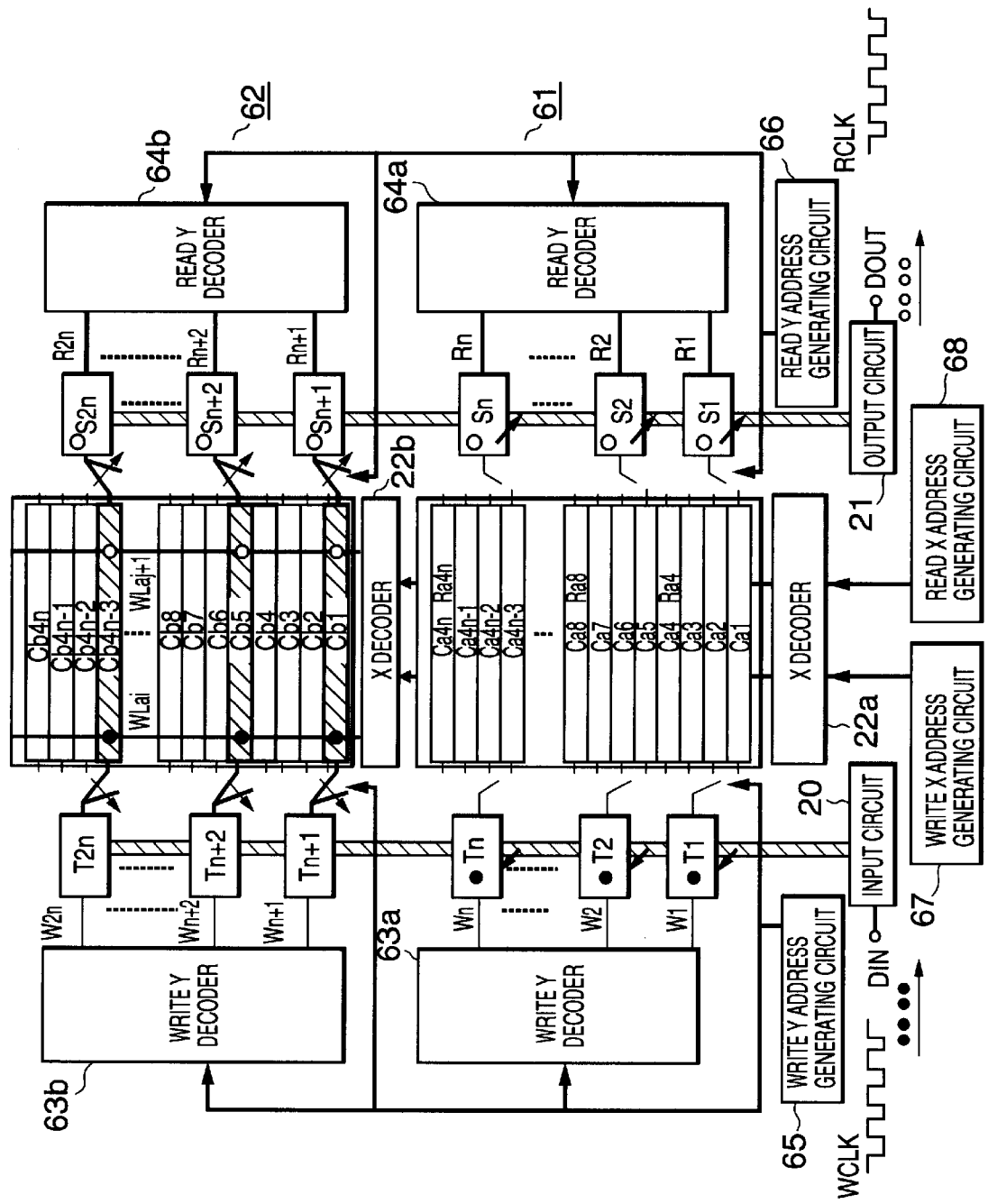
FIG. 17 is yet another schematic diagram showing more details of the operation of the serial access memory according to the first embodiment.

An operation that follows the foregoing operation will now be described with reference to FIG. 17.

In synchronization with the write clock signal WCLK, serial input data indicated by a series of consecutive black dots is supplied to the write data buses WD and WD/ via the input circuit 20. The input data is written to the write registers T1, T2 . . . Tn as output signals W1, W2 . . . Wn of the write Y decoder 63a are switched to the high level in order.

While the data is being written to the write registers T1, T2 . . . Tn, the information that has been transferred to the read registers S1, S2 . . . Sn is output in this order in synchronization with the read clock signal RCLK from the output circuit 21 via the read data buses RD and RD/, in the form of serial data denoted by a series of successive white dots.

Before the information that has been transferred to the read register Sn is output, a word line WLbj+1 of the second bank rises. The information in a plurality of memory cells connected to the word line WLbj+1 is amplified by their associated sense amplifiers, and defined on a bit line pair to which the sense amplifiers are connected. Thereafter, the information on the memory columns Cb1, Cb5 . . . Cb4n−3 is selectively transferred to the read registers Sn+1, Sn+2 . . . S2n by the switch SW4. The transfer that is performed beforehand allows the serial read from the read registers Sn+1, Sn+2 . . . S2n, which will be discussed with reference to FIG. 18, to be performed continuously in synchronization with the read clock signal RCLK after the serial read from the read registers S1, S2 . . . Sn.

Figure 18:
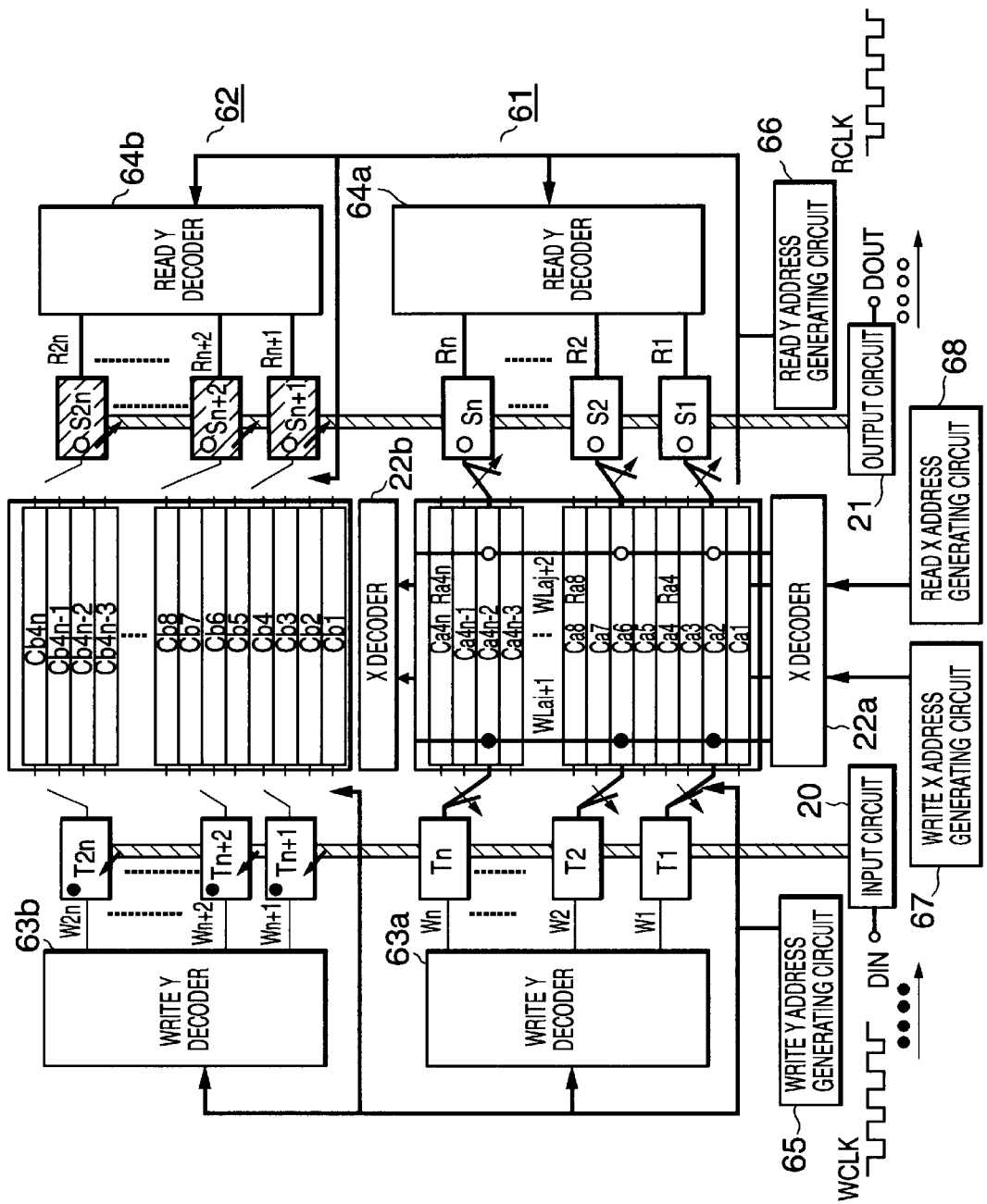
FIG. 18 is still another schematic diagram showing more details of the operation of the serial access memory according to the first embodiment.

An operation that follows the foregoing operation will now be described with reference to FIG. 18.

Successively, in synchronization with the write clock signal WCLK, serial input data indicated by a series of consecutive black dots is supplied to write data buses WD and WD/ via the input circuit 20. The serial input data is written to the write registers in the order of Tn+1, Tn+2 . . . T2n as output signals Wn+1, Wn+2 . . . W2n of the write Y decoder 63b are switched to the high level in order.

While the data is being written to the write registers Tn+1, Tn+2 . . . T2n, the word line WLai+1 selected by an X address obtained by incrementing the X address of a previous word line of the first bank 61 by one rises. Thereafter, the information that has been written to the write registers T1, T2 . . . Tn is transferred to the memory columns Ca2, Ca6 . . . Ca4n−2 selected by the switch SW2, then written to the memory cells connected to the word line WLai+1 in the memory columns.

While the write access is being made, the information that has been selectively transferred to the read registers Sn+1, Sn+2 . . . S2n is output in synchronization with the read clock signal RCLK from the output circuit 21 via the read data buses RD and RD/, in the form of serial data denoted by a series of successive white dots.

Before the information that has been transferred to the read register S2n is output, a word line WLaj+2 obtained by incrementing by one an X address of the word line WLaj+1 that has previously been risen in the first bank 61 rises. The information in a plurality of memory cells connected to the word line WLaj+2 is amplified by their associated sense amplifiers, and defined on a bit line pair to which the sense amplifiers are connected. Thereafter, the information on the memory columns Ca2, Ca6 . . . Ca4n−2 is selectively transferred to the read registers S1, S2 . . . Sn by the switch SW4. The transfer that is performed beforehand allows the serial read from the read registers S1, S2 . . . Sn to be performed continuously in synchronization with the read clock signal RCLK after the serial read from the read registers Sn+1, Sn+2 . . . S2n.

The sequences of the write transfer operation and the read transfer operation in the serial access memory in accordance with the present invention described above will now be described with reference to FIGS. 19 and 20.

FIG. 19 is a schematic diagram illustrating the write transfer operation in the serial access memory in accordance with the present invention. In the write transfer operation, serial data is first written in sequence to the write registers T1, T2 . . . Tn of the first bank 61. Then, as shown in FIG. 19A, the write registers T1, T2. . . . Tn are connected to memory columns C1, C5 . . . C4m−3, respectively, of the first bank 61. Next, the data that has been transferred to the write registers T1, T2 . . . Tn i s written to the memory cells connected to a particular word line among the memory columns C1, C5 . . . C4m−3. Meanwhile, the successive serial data is written in sequence to the write registers Tn+1, Tn+2 . . . T2n of the second bank 62.

Subsequently, as shown in FIG. 19B, the write registers Tn+1, Tn+2 . . . T2n are connected to memory columns C4m+1, C4m+5 . . . Cm−3, respectively, of the second bank 62. Next, the data that has been transferred to the write registers Tn+1, Tn+2 . . . T2n is written to the memory cells connected to a particular word line among the memory columns C4m+1, C4m+5 . . . C8m−3. Meanwhile, the successive serial data is written in sequence to the write registers T1, T2 . . . Tn of the first bank 61.

Thereafter, as shown in FIG. 19C, the write registers T1, T2 . . . Tn are connected to memory columns C2, C6 . . . C4m−2, respectively, of the first bank 61. Next, the data that has been transferred to the write registers T1, T2 . . . Tn is written to the memory cells connected to a word line obtained by incrementing by one the word line that has been designated in FIG. 19A among the memory columns C2, C6 . . . C4m−2. Meanwhile, the successive serial data is written in sequence to the write registers Tn+1, Tn+2 . . . T2n of the second bank 62.

Furthermore, as shown in FIG. 19D, the write registers Tn+1, Tn+2 . . . T2n are connected to memory columns C4m+2, C4m+6 . . . C8m−2, respectively, of the second bank 62. Then, the data that has been transferred to the write registers Tn+1, Tn+2 . . . T2n is written to the memory cells connected to a word line obtained by incrementing by one the word line that has been designated in FIG. 19B among the memory columns C4m+2, C4m+6 . . . C8m−2. Meanwhile, the successive serial data is written in sequence to the write registers T1, T2 . . . Tn of the first bank 61.

Subsequently, as shown in FIG. 19E, the write registers T1, T2 . . . Tn are connected to memory columns C3, C7 . . . C4m−1, respectively, of the first bank 61. Next, the data that has been transferred to the write registers T1, T2 . . . Tn is written to the memory cells connected to a word line obtained by incrementing by one the word line that has been designated in FIG. 19C among the memory columns C3, C7 . . . C4m−1. Meanwhile, the successive serial data is written in sequence to the write registers Tn+1, Tn+2 . . . T2n of the second bank 62.

Furthermore, as shown in FIG. 19F, the write registers Tn+1, Tn+2 . . . T2n are connected to memory columns C4m+3, C4m+7 . . . C8m−1, respectively, of the second bank 62. Then, the data that has been transferred to the write registers Tn+1, Tn+2 . . . T2n is written to the memory cells connected to a word line obtained by incrementing by one the word line that has been designated in FIG. 19D among the memory columns C4m+3, C4m+7 . . . C8m−1. meanwhile, the successive serial data is written in sequence to the write registers T1, T2 . . . Tn of the first bank 61.

Thereafter, as shown in FIG. 19G, the write registers T1, T2 . . . Tn are connected to memory columns C4, C8 . . . C4m, respectively, of the first bank 61. Then, the data that has been transferred to the write registers T1, T2 . . . Tn is written to the memory cells connected to a word line obtained by incrementing by one the word line that has been designated in FIG. 19E among the memory columns C4, C8 . . . C4m. Meanwhile, the successive serial data is written in sequence to the write registers Tn+1, Tn+2 . . . T2n of the second bank 62.

Furthermore, as shown in FIG. 19H, the write registers Tn+1, Tn+2 . . . T2n are connected to memory columns C4m+4, C4m+8 . . . C8m, respectively, of the s econd bank 62. Then, the data that has been transferred to the write registers Tn+1, Tn+2 . . . T2n is written to the memory cells connected to a word line obtained by incrementing by one the word line that has been designated in FIG. 19F among the memory columns C4m+4, C4m+8 . . . C8m. Meanwhile, the successive serial data is written in sequence to the write registers T1, T2 . . . Tn of the first bank 61.

After that, the connection relationship between the write registers and the memory columns returns to the one illustrated in FIG. 19A, and the serial write is implemented by incrementing addresses of word lines in sequence following the one shown in FIG. 19H.

FIG. 20 is a schematic diagram illustrating the read transfer operation in the serial access memory in accordance with the present invention. In the read transfer operation, as shown in FIG. 20A, memory columns C1, C5 . . . C4m−3 and the read registers S1, S2 . . . Sn of the first bank 61 are respectively connected. Then, data in memory cells connected to a particular word line among the memory columns C1, C5 . . . C4m−3 is read, and transferred to the read registers S1, S2 . . . Sn.

Subsequently, as shown in FIG. 20B, memory columns C4m+1, C4m+5 . . . C8m−3 and the read registers Sn, Sn+1 . . . S2n of the second bank 62 are respectively connected. Then, data in memory cells connected to a particular word line among the memory columns C4m+1, C4m+5 . . . C8m−3 is read, and transferred to the read registers Sn, Sn+1 . . . S2n. Meanwhile, in the first bank 61, the data that has been transferred to the read registers S1, S2 . . . Sn is output in sequence to a read data bus so as to output as successive serial data.

Thereafter, as shown in FIG. 20C, memory columns C2, C6 . . . C4m−2 and the read registers S1, S2 . . . Sn of the first bank 61 are respectively connected. Then, data in memory cells connected to a word line obtained by incrementing by one the word line designated in FIG. 20A among the memory columns C2, C6 . . . C4m−2 is read, and transferred to the read registers S1, S2 . . . Sn. Meanwhile, in the second bank 62, the data that has been transferred to the read registers Sn+1, Sn+2 . . . S2n is output in sequence to a read data bus so as to output as successive serial data.

Furthermore, as shown in FIG. 20D, memory columns C4m+2, C4m+6 . . . C8m−2 and the read registers Sn+1, Sn+2 . . . S2n of the second bank 62 are respectively connected. Then, data in memory cells connected to a word line obtained by incrementing by one the word line designated in FIG. 20B among the memory columns C4m+2, C4m+6 . . . C8m−2 is read, and transferred to the read registers Sn+1, Sn+2 . . . S2n. Meanwhile, in the first bank 61, the data that has been transferred to the read registers S1, S2 . . . Sn is output in sequence to a read data bus so as to output as successive serial data.

Thereafter, as shown in FIG. 20E, memory columns C3, C7 . . . C4m−1 and the read registers S1, S2 . . . Sn of the first bank 61 are respectively connected. Then, data in memory cells connected to a word line obtained by incrementing by one the word line designated in FIG. 20C among the memory columns C3, C7 . . . C4m−1 is read, and transferred to the read registers S1, S2 . . . Sn. Meanwhile, in the second bank 62, the data that has been transferred to the read registers Sn+1, Sn+2 . . . S2n is output in sequence to a read data bus so as to output as successive serial data.

Subsequently, as shown in FIG. 20F, memory columns C4m+3, C4m+7 . . . C8m−1 and the read registers Sn+1, Sn+2 . . . S2n of the second bank 62 are respectively connected. Then, data in memory cells connected to a word line obtained by incrementing by one the word line designated in FIG. 20D among the memory columns C4m+3, C4m+7 . . . C8m−1 is read, and transferred to the read registers Sn+1, Sn+2 . . . S2n. Meanwhile, in the first bank 61, the data that has been transferred to the read registers S1, S2 . . . Sn is output in sequence to a read data bus so as to output as successive serial data.

Next, as shown in FIG. 20G, memory columns C4, C8 . . . C4m and the read registers S1, S2 . . . Sn of the first bank 61 are respectively connected. Then, data in memory cells connected to a word line obtained by incrementing by one the word line designated in FIG. 20E among the memory columns C4, C8 . . . C4m is read, and transferred to the read registers S1, S2 . . . Sn. Meanwhile, in the second bank 62, the data that has been transferred to the read registers Sn+1, Sn+2 . . . S2n is output in sequence to a read data bus so as to output as successive serial data.

Subsequently, as shown in FIG. 20H, memory columns C4m+4, C4m+8 . . . C8m and the read registers Sn+1, Sn+2 . . . S2n of the second bank 62 are respectively connected. Then, data in memory cells connected to a word line obtained by incrementing by one the word line designated in FIG. 20F among the memory columns C4m+4, C4m+8 . . . C8m is read, and transferred to the read registers Sn+1, Sn+2 . . . S2n. Meanwhile, in the first bank 61, the data that has been transferred to the read registers S1, S2 . . . Sn is output in sequence to a read data bus so as to output as successive serial data.

Thereafter, the connection relationship between the read registers and the memory columns returns to the one illustrated in FIG. 20A, and the serial read is implemented by incrementing addresses of word lines in sequence following the one shown in FIG. 20H.

As described in detail above, the serial access memory in accordance with the present invention allows the number of registers for memory columns to be reduced, making it possible to produce a register pattern with an allowance. This provides an advantage in that a chip size can be reduced without adding any change to a conventional process, thus saving cost for process development and reducing a chip size at the same time.

What is claimed is:

1. A serial access memory comprising:
   an input circuit to which data is supplied;
   a write data bus connected to the input circuit;
   a first decoder that outputs a first selection signal in response to an address signal received thereto;
   a write register for temporarily storing data;
   a first switch connected between the write data bus and the write register for electrically connecting the write data bus with the write register in response to the first selection signal;
   a memory array including a plurality of memory columns, each of which has a word line and a plurality of memory cells connected to the word line; and
   a second switch connected between the write register and the memory columns for electrically connecting the write register with the memory columns in response to a second selection signal, wherein the write register is connected to a predetermined number of the memory columns via the second switch.

2. A serial access memory according to claim 1, wherein the write data bus exte nds in a first direction, and the word line extends in a second direction that is substantially perpendicular to the first direction.

3. A serial access memory according to claim 1, wherein each of the memory cells includes a transistor and a capacitor.

4. A serial access memory according to claim 1, wherein each of the memory columns has a sense amplifier.

5. A serial access memory according to claim 1, further comprising:
   an output circuit for outputting data;
   a read data bus connected to the output circuit;
   a second decoder for outputting a third selection signal in response to an address signal received thereto;
   a read register for temporarily storing data;
   a third switch connected between the read data bus and the read register for electrically connecting the read data bus with the read register in response to the third selection signal; and
   a fourth switch connected between the read register and the memory columns for electrically connecting the read register with the memory columns in response to a fourth selection signal, wherein the read register is connected to a predetermined number of the memory columns via the forth switch.

6. A serial access memory according to claim 5, wherein the write data bus and the read data bus extend in a first direction, and the word line extends in a second direction that is substantially perpendicular to the first direction.

7. A serial access memory according to claim 5, wherein the read register is connected to one end of the memory column via the second switch, and the write register is connected to the other end of the memory column via the fourth switch.

8. A serial access memory according to claim 5, wherein the read register is connected to one end of the memory column via the second switch, and the write register is also connected to the one end of the memory column via the fourth switch.

9. A serial access memory according to claim 5, wherein a plurality of memory columns are connected to the read register at their one end and the other end alternately via the second switch and to the write register via the fourth switch, and a sense amplifier is disposed on a further outer side of the read register and the write register.

10. A serial access memory according to claim 5, wherein the memory columns includes a plurality of first memory columns disposed in a first array, a plurality of second memory columns each disposed between the first columns in the first area and extending to a second area, and a plurality of third memory columns each disposed between the second columns in the second area;
   the read register is connected via the second switch to an outer end of one of the first and the third memory columns, the write register is connected via the fourth switch to the outer end of one of the first and third memory columns, and a sense amplifier is disposed on a further outer side of the read register or the write register; and the read register is located between the first and second arrays and is connected to one of the second memory columns via the second switch, the write register is located between the first and second arrays and is connected to one of the second memory columns via the fourth switch, and the sense amplifier is disposed between the first and second arrays.

11. A serial access memory according to claim 10, wherein the memory array is divided into two banks, each of the banks operating individually.

12. A serial access memory according to claim 1, wherein the second selection signal is generated in response to the address signal and a write transfer signal.

13. A serial access memory according to claim 5, wherein the second selection signal is generated in response to the address signal and the write transfer signal, and the fourth selection signal is generated in response to the address signal and a read transfer signal.

14. A serial access memory comprising:
an output circuit for outputting data;
a read data bus connected to the output circuit;
a first decoder for outputting a first selection signal in response to an address signal received thereto;
a read register for temporarily storing data;
a first switch connected between the read data bus and the read register for electrically connecting the read data bus with the read register in response to the first selection signal;
a memory array including a plurality of memory columns, each of which has a word line and a plurality of memory cells connected to the word line; and
a second switch connected between the read register and the memory columns for electrically connecting the read register with the memory columns in response to a second selection signal, wherein the read register is connected to a predetermined number of the memory columns via the second switch.

15. A serial access memory according to claim 14, wherein the read data bus extends in a first direction, and the word line extends in a second direction substantially perpendicular to the first direction.

16. A serial access memory according to claim 14, wherein each of the memory cells includes a transistor and a capacitor.

17. A serial access memory according to claim 14, wherein each of the memory columns has a sense amplifier.

18. A serial access memory according to claim 14, wherein the memory array is divided into two banks, each of the banks operating individually.

19. A serial access memory according to claims 14, wherein the second selection signal is generated in response to the address signal and a read transfer signal.

20. A write transfer method for a serial access memory having first and second memory banks each including write data registers connected to a write data bus, and memory columns having memory cells, a predetermined number of the memory columns being selectively connected to one of the write data registers, the write transfer method comprising the steps of:

designating a first X address;
supplying data on the write data bus to the write data registers of the first memory bank, and connecting the write data register of the second memory bank to a first memory column among the predetermined number of the memory columns so as to write the data in the write data register to a memory cell designated by the first X address within the connected memory column;

supplying data on the write data bus to the write data registers of the second memory bank, and connecting the write data register of the first memory bank to a first memory column among the predetermined number of the memory columns so as to write the data in the write data register to a memory cell designated by the first X address within the connected memory column;

supplying data on the write data bus to the write data registers of the first memory bank, and connecting the write data register of the second memory bank to a second memory column among the predetermined number of the memory columns so as to write the data in the write data register to a memory cell designated by the first X address within the connected memory column; and supplying data on the write data bus to the write data registers of the second memory bank, and connecting the write data register of the firs t memory bank to a second memory column among the predetermined number of the memory columns so as to write the data in the write data register to a memory cell designated by the first X address of the connected memory column.

21. A write transfer method according to claim 20, further comprising the steps of
supplying data on the write data bus to the write data registers of the first memory bank, and connecting the write data register of the second memory bank to a third to last memory column in turn among the predetermined number of the memory columns so as to write the data in the write data register to a memory cell designated by the first X address within the connected memory column; and supplying data on the write data bus to the write data registers of the second memory bank, and serially connecting the write data register of the first memory bank to third to last memory columns in turn among the predetermined number of the memory columns so as to write the data in the write data register to a memory cell designated by the first X address of the connected memory column.

22. A write transfer method according to claim 21, further comprising a step of designating a second X address after all memory cells designated by the first X address are accessed.

23. A write transfer method according to claim 22, further comprising the steps of
supplying data on the write data bus to the write data registers of the first memory bank, and connecting the write data register of the second memory bank to a first memory column among the predetermined number of the memory columns so as to write the data in the write data register to a memory cell designated by the second X address within the connected memory column; and supplying data on the write data bus to the write data registers of the second memory bank, and connecting the write data register of the first memory bank to a first memory column among the predetermined number of the memory columns so as to write the data in the write data register to a memory cell designated by the second X address within the connected memory column.

24. A read transfer method for a serial access memory having first and second memory banks each including read data registers connected to a read data bus and memory columns having memory cells, a predetermined number of the memory columns being selectively connected to one of the read data registers, the read transfer method comprising the steps of:

designating a first X address;

connecting a first memory column among the predetermined number of the memory columns of the first memory bank to the read data register, outputting data stored in a memory cell designated by the first X address within the connected memory column to the read data register, and outputting data stored in the read data register of the second memory bank to the read data bus;

connecting a first memory column among the predetermined number of the memory columns of the second memory bank to the read data register, outputting data stored in a memory cell designated by the first X address within the connected memory column to the read data register, and outputting data stored in the read data register of the first memory bank to the read data bus;

connecting a second memory column among the predetermined number of the memory columns of the first memory bank to the read data register, outputting data stored in a memory cell designated by the first X address within the connected memory column to the read data register, and outputting data stored in the read data register of the second memory bank to the read data bus; and connecting a second memory column among the predetermined number of the memory columns of the second memory bank to the read data register, outputting data stored in a memory cell designated by the first X address within the connected memory column to the read data register, and outputting data stored in the read data register of the first memory bank to the read data bus.

25. A read transfer method according to claim 24, further comprising the steps of connecting third to last memory columns in turn among the predetermined number of the memory columns of the first memory bank to the read data register, outputting data stored in a memory cell designated by the first X address within the connected memory column to the read data register, and outputting data stored in the read data register of the second memory bank to the read data bus; and connecting third to last memory columns in turn among the predetermined number of the memory columns of the second memory bank to the read data register, outputting data stored in a memory cell designated by the first X address within the connected memory column to the read data register, and outputting data stored in the read data register of the first memory bank to the read data bus.

26. A read transfer method according to claim 25, further comprising a steps of designating a second X address after all memory cells designated by the first X address are accessed.

27. A read transfer method according to claim 26, further comprising the steps of connecting a first memory column among the predetermined number of the memory columns of the first memory bank to the read data register, outputting data stored in a memory cell designated by the second X address within the connected memory column to the read data register, and outputting data stored in the read data register of the second memory bank to the read data bus; and connecting a first memory column among the predetermined number of the memory columns of the second memory bank to the read data register, outputting data stored in a memory cell designated by the second X address within the connected memory column to the read data register, and outputting data stored in the read data register of the first memory bank to the read data bus.

28. A data transfer method for a serial access memory having first and second memory banks each including write data registers connected to a write data bus, read data registers connected to a read data bus and memory columns having memory cells, one of a predetermined number of the memory columns being selectively connected to one of the read data registers and one of the write data registers, the data transfer method comprising the steps of:

designating a first X address;

supplying data on the write data bus to the write data registers of the first memory bank, connecting a first memory column among the predetermined number of the memory columns of the first memory bank to the read data register, connecting the write data register of the second memory bank to a first memory column among the predetermined number of the memory columns so as to write the data in the write data register to a memory cell designated by the first X address within the connected memory column, outputting data stored in a memory cell designated by the first X address within the connected memory column to the read data register, and outputting data stored in the read data register of the second memory bank to the read data bus;

supplying data on the write data bus to the write data registers of the second memory bank, connecting a first memory column among the predetermined number of the memory columns of the second memory bank to the read data register, connecting the write data register of the first memory bank to a first memory column among the predetermined number of the memory columns so as to write the data in the write data register to a memory cell designated by the first X address within the connected memory column, outputting data stored in a memory cell designated by the first X address within the connected memory column to the read data register, and outputting data stored in the read data register of the first memory bank to the read data bus;

supplying data on the write data bus to the write data registers of the first memory bank, connecting a second memory column among the predetermined number of the memory columns of the first memory bank to the read data register, connecting the write data register of the second memory bank to a second memory column among the predetermined number of the memory columns so as to write the data in the write data register to a memory cell designated by the first X address within the connected memory column, outputting data stored in a memory cell designated by the first X address within the connected memory column to the read data register, and outputting data stored in the read data register of the second memory bank to the read data bus; and supplying data on the write data bus to the write data registers of the second memory bank, connecting a second memory column among the predetermined number of the memory columns of the second memory bank to the read data register, connecting the write data register of the first memory bank to a second memory column among the predetermined number of the memory columns so as to write the data in the write data register to a memory cell designated by the first X address of the connected memory column, outputting data stored in a memory cell designated by the first X address within the connected memory column to the read data register, and outputting data stored in the read data register of the first memory bank to the read data bus.

29. A data transfer method according to claim 28, further comprising the steps of supplying data on the write data bus to the write data registers of the first memory bank, connecting third to last memory columns in turn among the predetermined number of the memory columns of the first memory bank to the read data register, connecting the write data register of the second memory bank to third to last memory columns in turn among the predetermined number of the memory columns so as to write the data in the write data register to a memory cell designated by the first X address within the connected memory column, outputting data stored in a memory cell designated by the first X address within the connected memory column to the read data register, and outputting data stored in the read data register of the second memory bank to the read data bus;

supplying data on the write data bus to the write data registers of the second memory bank, connecting third to last memory columns in turn among the predetermined number of the memory columns of the second memory bank to the read data register, connecting the write data register of the first memory bank to third to last memory columns in turn among the predetermined number of the memory columns so as to write the data in the write data register to a memory cell designated by the first X address within the connected memory column, outputting data stored in a memory cell designated by the first X address within the connected memory column to the read data register, and outputting data stored in the read data register of the first memory bank to the read data bus.

30. A data transfer method according to claim 29, further comprising a steps of designating a second X address after all memory cells designated by the first X address are accessed.

31. A data transfer method according to claim 30, further comprising the steps of supplying data on the write data bus to the write data registers of the first memory bank, connecting a first memory column among the predetermined number of the memory columns of the first memory bank to the read data register, connecting the write data register of the second memory bank to a first memory column among the predetermined number of the memory columns so as to write the data in the write data register to a memory cell designated by the second X address within the connected memory column, outputting data stored in a memory cell designated by the second X address within the connected memory column to the read data register, and outputting data stored in the read data register of the second memory bank to the read data bus; and supplying data on the write data bus to the write data registers of the second memory bank, connecting a first memory column among the predetermined number of the memory columns of the second memory bank to the read data register, connecting the write data register of the first memory bank to a first memory column among the predetermined number of the memory columns so as to write the data in the write data register to a memory cell designated by the second X address within the connected memory column, outputting data stored in a memory cell designated by the second X address within the connected memory column to the read data register, and outputting data stored in the read data register of the first memory bank to the read data bus.

* * * * *